United States Patent
Toledo et al.

(10) Patent No.: US 10,361,582 B2
(45) Date of Patent: Jul. 23, 2019

(54) POWER METERING AND CONTROL SYSTEM ADAPTABLE TO MULTI-STANDARD DEVICE

(71) Applicant: AltEn, LLC, Salt Lake City, UT (US)

(72) Inventors: David Toledo, Salt Lake City, UT (US); Paul Slusser, Holladay, UT (US)

(73) Assignee: Power Practical, Inc., Salt Lake City, UT (US)

( * ) Notice: Subject to any disclaimer, the term of this patent is extended or adjusted under 35 U.S.C. 154(b) by 0 days.

(21) Appl. No.: 15/267,361

(22) Filed: Sep. 16, 2016

(65) Prior Publication Data

US 2017/0005507 A1    Jan. 5, 2017

Related U.S. Application Data

(63) Continuation of application No. 14/109,332, filed on Dec. 17, 2013, now Pat. No. 9,479,003, which is a
(Continued)

(51) Int. Cl.
*H02J 7/35* (2006.01)
*H02J 7/00* (2006.01)
(Continued)

(52) U.S. Cl.
CPC ............ *H02J 7/35* (2013.01); *H01L 35/30* (2013.01); *H02J 7/007* (2013.01); *H02J 7/0045* (2013.01);
(Continued)

(58) Field of Classification Search
CPC .. H02J 7/35; H02J 7/355; H02J 7/0045; H02J 7/0047; H02J 7/007; H02J 2007/005;
(Continued)

(56) References Cited

U.S. PATENT DOCUMENTS 2,987,564 A   6/1961   Imelmann
3,081,364 A   3/1963   Henderson et al.
(Continued)

OTHER PUBLICATIONS

TEG Power, "TEG Power Brick (AKA "Ice TEG")" retrieved from Internet http://www.tegpower.com/pro2.htm on Apr. 20, 2012, 3 pages.
(Continued)

*Primary Examiner* — Richard Isla
*Assistant Examiner* — Mohammed J Sharief
(74) *Attorney, Agent, or Firm* — Lathrop Gage LLP

(57) ABSTRACT

Apparatus for powering a smart load capable of receiving power at a first power-reception level and a second power-reception level greater than the first power-reception level includes a solar panel and a connector operably coupled to the solar panel. A monitoring device is configured to monitor a power-reception level of the smart load when the smart load is coupled to the connector. The apparatus includes an interrupting device configured to interrupt power flow to the smart load based on a determination that the smart load is receiving power at the first power-reception level. The smart load receives power at the second power-reception level in response to the interruption.

14 Claims, 16 Drawing Sheets

Related U.S. Application Data continuation-in-part of application No. 13/332,237, filed on Dec. 20, 2011, now Pat. No. 8,674,530.

(60) Provisional application No. 61/879,987, filed on Sep. 19, 2013, provisional application No. 61/862,791, filed on Aug. 6, 2013, provisional application No. 61/738,345, filed on Dec. 17, 2012, provisional application No. 61/425,699, filed on Dec. 21, 2010.

(51) Int. Cl.
  *H02M 3/156* (2006.01)
  *H01L 35/30* (2006.01)
  *H02S 40/38* (2014.01)

(52) U.S. Cl.
  CPC .......... *H02J 7/0047* (2013.01); *H02M 3/156* (2013.01); *H02S 40/38* (2014.12); *H02J 2007/005* (2013.01); *H02J 2007/0096* (2013.01); *H02J 2007/0098* (2013.01)

(58) Field of Classification Search
  CPC ...... H02J 2007/0096; H02J 2007/0098; Y02E 60/12; H01M 10/465; H01M 16/006; H02S 40/38; H01L 35/30; H02M 3/156
  USPC ....................................................... 320/101
  See application file for complete search history.

(56) References Cited

U.S. PATENT DOCUMENTS

| | | | |
|---|---|---|---|
| 3,082,276 A | 3/1963 | Corry et al. | |
| 3,123,726 A | 3/1964 | Maynard | |
| 3,321,840 A | 5/1967 | Pedersen | |
| 3,384,806 A | 5/1968 | Hartman | |
| 5,311,112 A * | 5/1994 | Creaco | H02J 7/0021 320/119 |
| 5,544,488 A | 8/1996 | Reid | |
| 5,552,696 A | 9/1996 | Trainor et al. | |
| 5,589,757 A * | 12/1996 | Klang | H01M 10/44 320/160 |
| 6,046,582 A | 4/2000 | Sanelli et al. | |
| 6,134,130 A | 10/2000 | Connell et al. | |
| 6,472,846 B1 * | 10/2002 | Hutchinson | H02J 7/0068 320/114 |
| 6,528,957 B1 * | 3/2003 | Luchaco | H05B 37/034 307/31 |
| 6,588,419 B1 | 7/2003 | Buezis et al. | |
| 6,787,691 B2 | 9/2004 | Fleurial et al. | |
| 2002/0194517 A1 * | 12/2002 | Cohen | G06F 1/26 713/340 |
| 2004/0062058 A1 | 4/2004 | Hann et al. | |
| 2007/0290555 A1 | 12/2007 | Caren | |
| 2008/0007212 A1 * | 1/2008 | Theytaz | H02J 7/0013 320/107 |
| 2008/0042616 A1 * | 2/2008 | Monks | H04L 12/10 320/106 |
| 2008/0084117 A1 * | 4/2008 | Sander | H02J 7/35 307/46 |
| 2008/0084178 A1 * | 4/2008 | Dowd | H01M 10/42 320/101 |
| 2008/0197802 A1 * | 8/2008 | Onishi | H02J 5/005 320/106 |
| 2009/0205694 A1 | 8/2009 | Huettner et al. | |
| 2011/0210693 A1 * | 9/2011 | Reichart | H01M 10/465 320/101 |
| 2011/0273133 A1 * | 11/2011 | Sala | H01M 10/465 320/101 |
| 2011/0284047 A1 | 11/2011 | Johnson et al. | |
| 2012/0181971 A1 | 7/2012 | Birkeland et al. | |
| 2012/0256581 A1 * | 10/2012 | Lee | H02J 1/14 320/101 |

OTHER PUBLICATIONS

Stealth Power Systems, "Multi-Purpose Power System," retrieved from Internet http://www.stealthpowersystems.com on Apr. 20, 2012, 1 page.
Termo-Gen AB, "Thermoelectric Mobile Charger," retrieved from Internet http://www.tragia.se. Applicant admitted prior art.
Hatsuden-Nabe Thermoelectric Cookpot Keeps Your iPhone Battery Charged, dated Jun. 14, 2011, retrieved from the Internet http://www.tuaw.com/2011/06/14/hatsuden-nabe-thermoelectric-cookpot-keeps---your-iPhone-battery-c/ on Apr. 20, 2012, 3 pages.
Biolite, "Introducing the All New Biolite CampStove," retrieved from the Internet http://biolitestove.com/BioLite.html, on Apr. 20, 2012, 1 page.
Tellurex World Pot, "Remote Village—Dead Cell Phone—Need Help Now, If Your Can Start a Fire, Now You Can Place a Call," Jul. 8, 2011, retrieved from the Internet http://www.tellurex.com/about/world.sub.—pot.php on Apr. 20, 2012, 8 pages.
Emad Hanna, "Camping Pot Let's You Cook Up Some Electricity", Jun. 22, 2011, Discovery News, http://news.discovery.com/tech/camping-pot-lets-you-cook-up-some-electricity-110622.html.

* cited by examiner

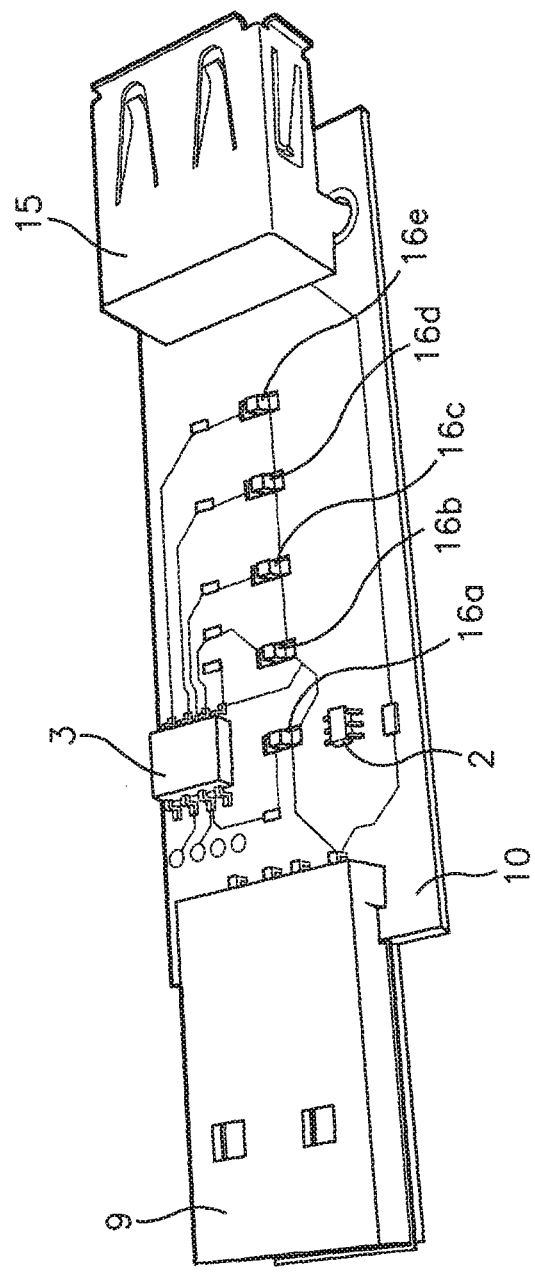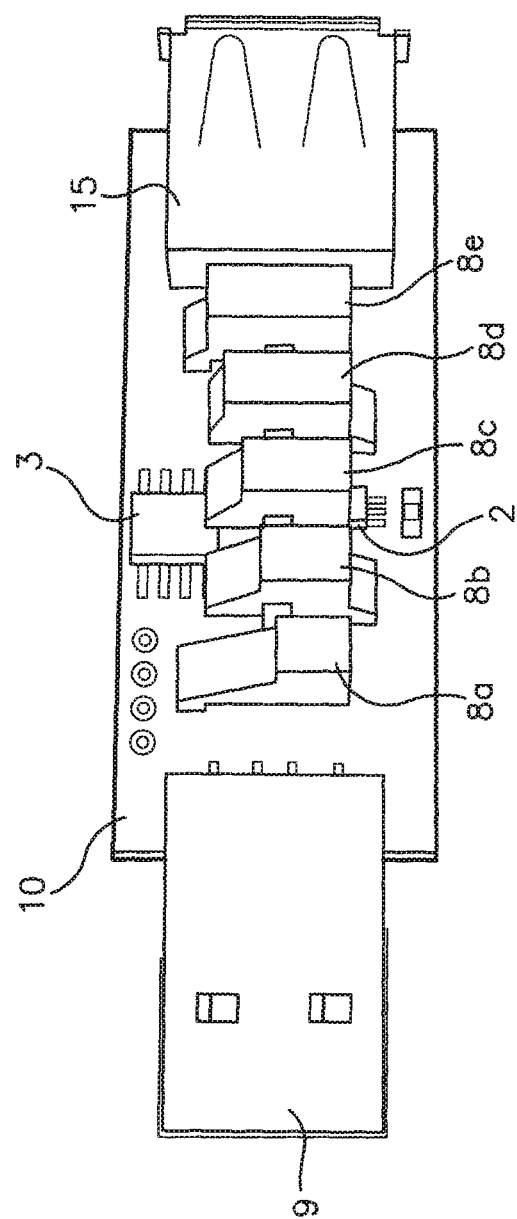
Fig. 5

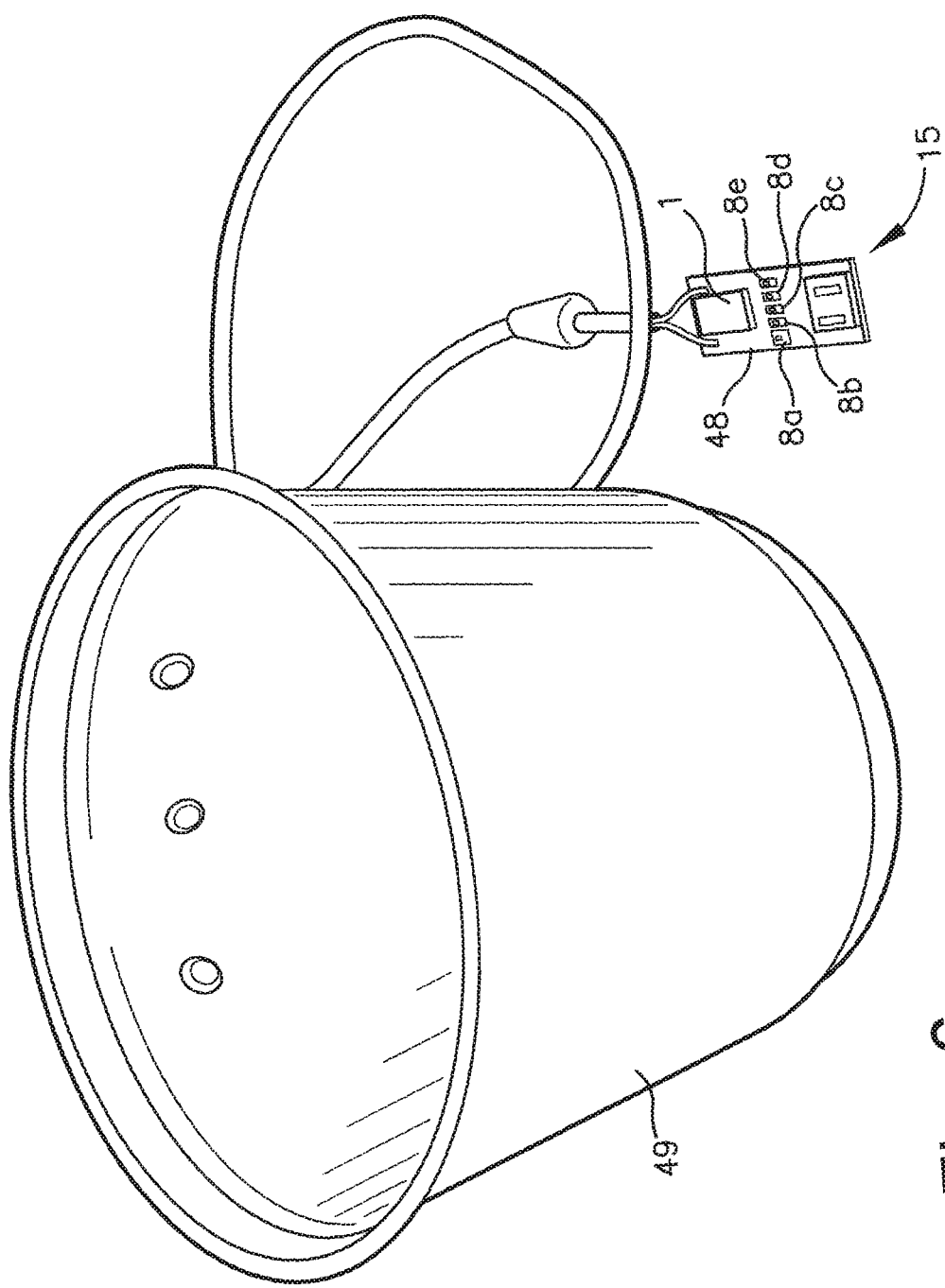

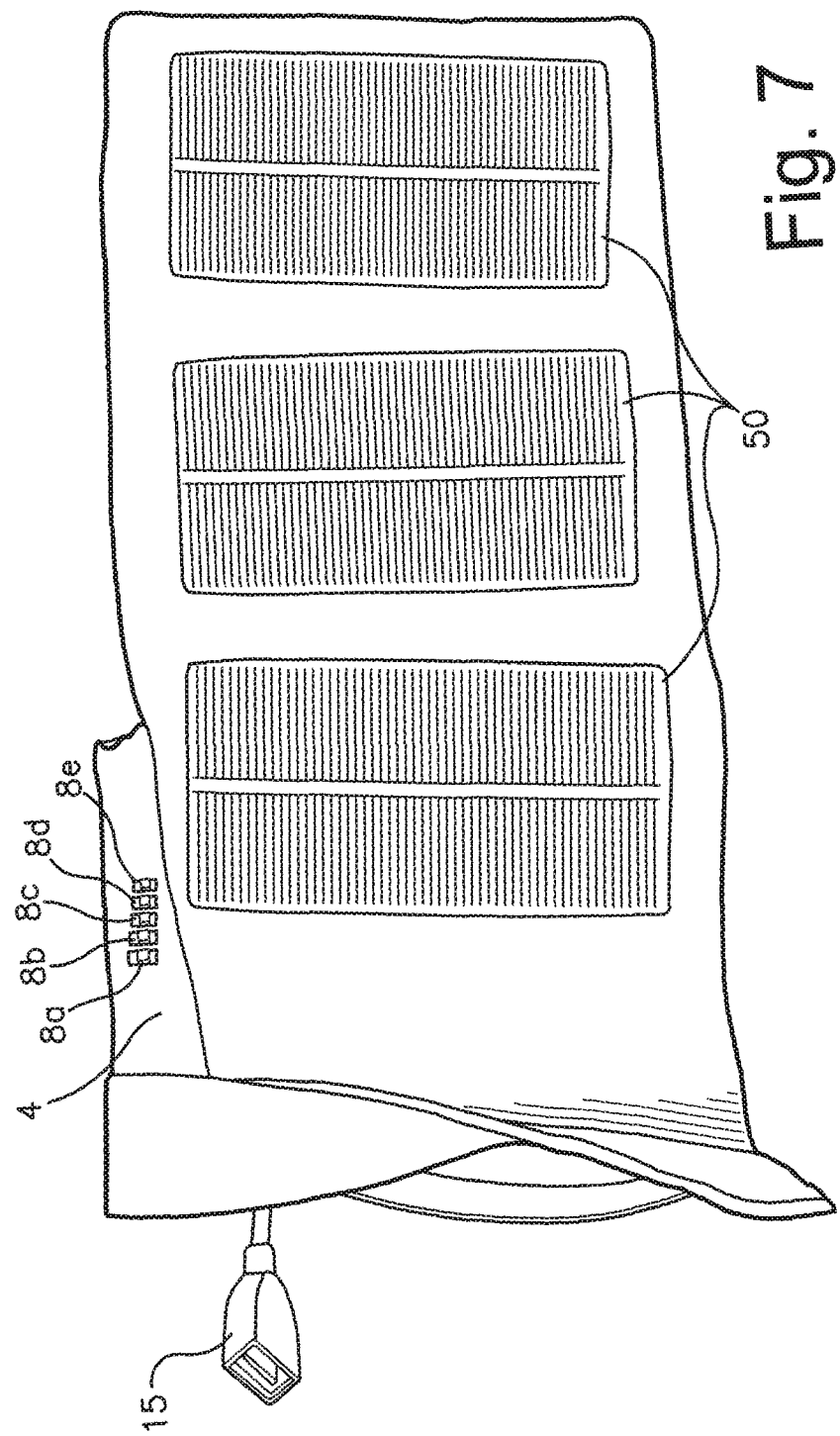

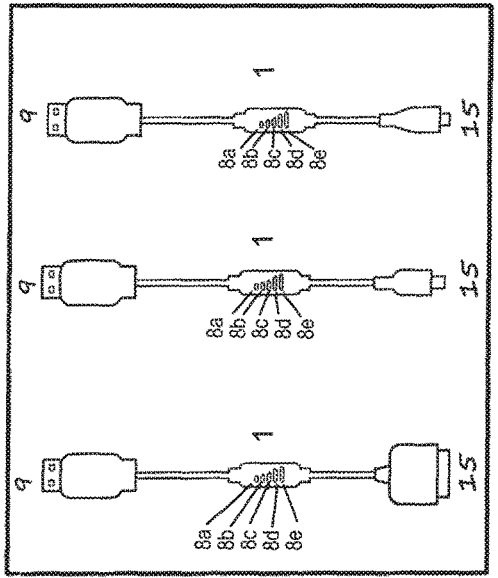
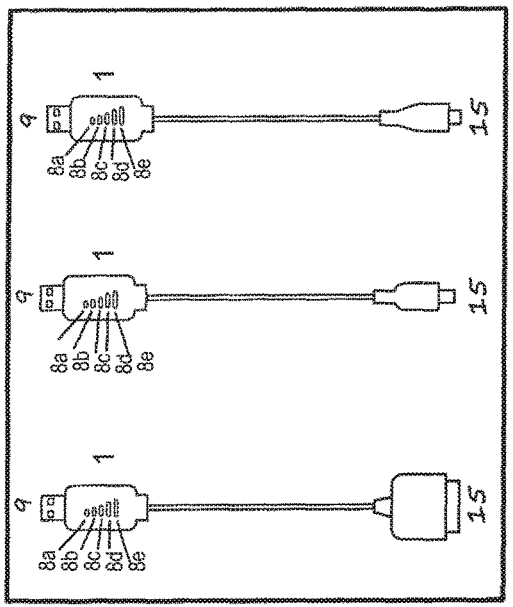
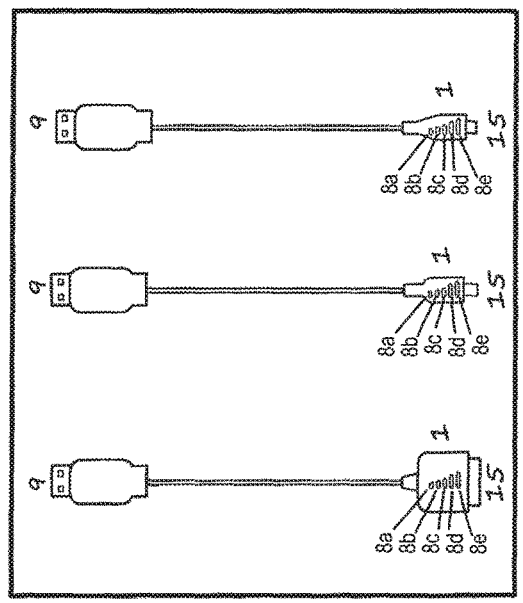
Fig. 9a
Fig. 9b
Fig. 9c

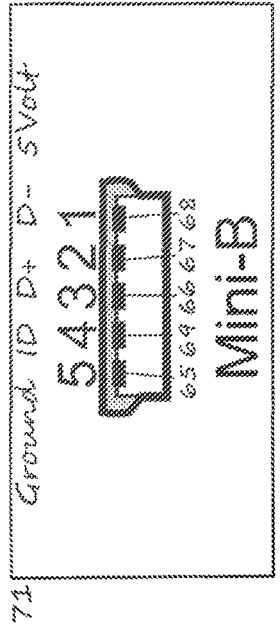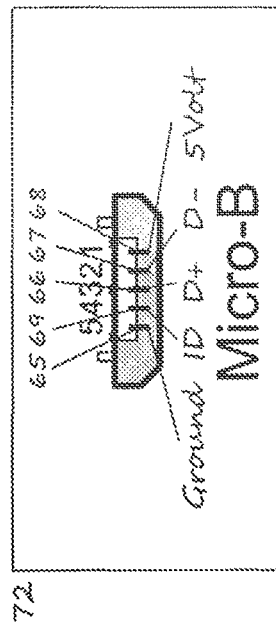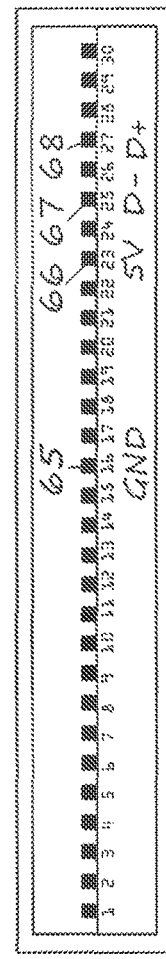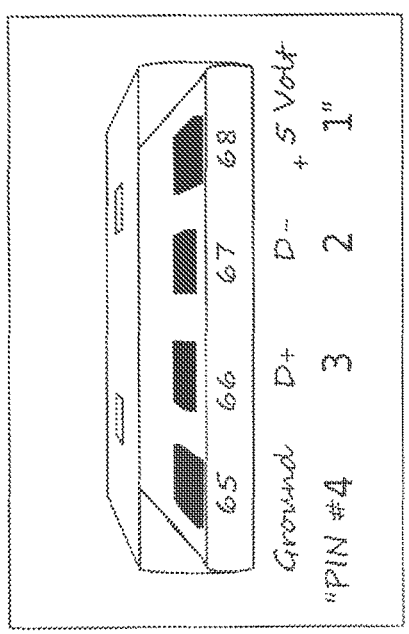
Fig. 11

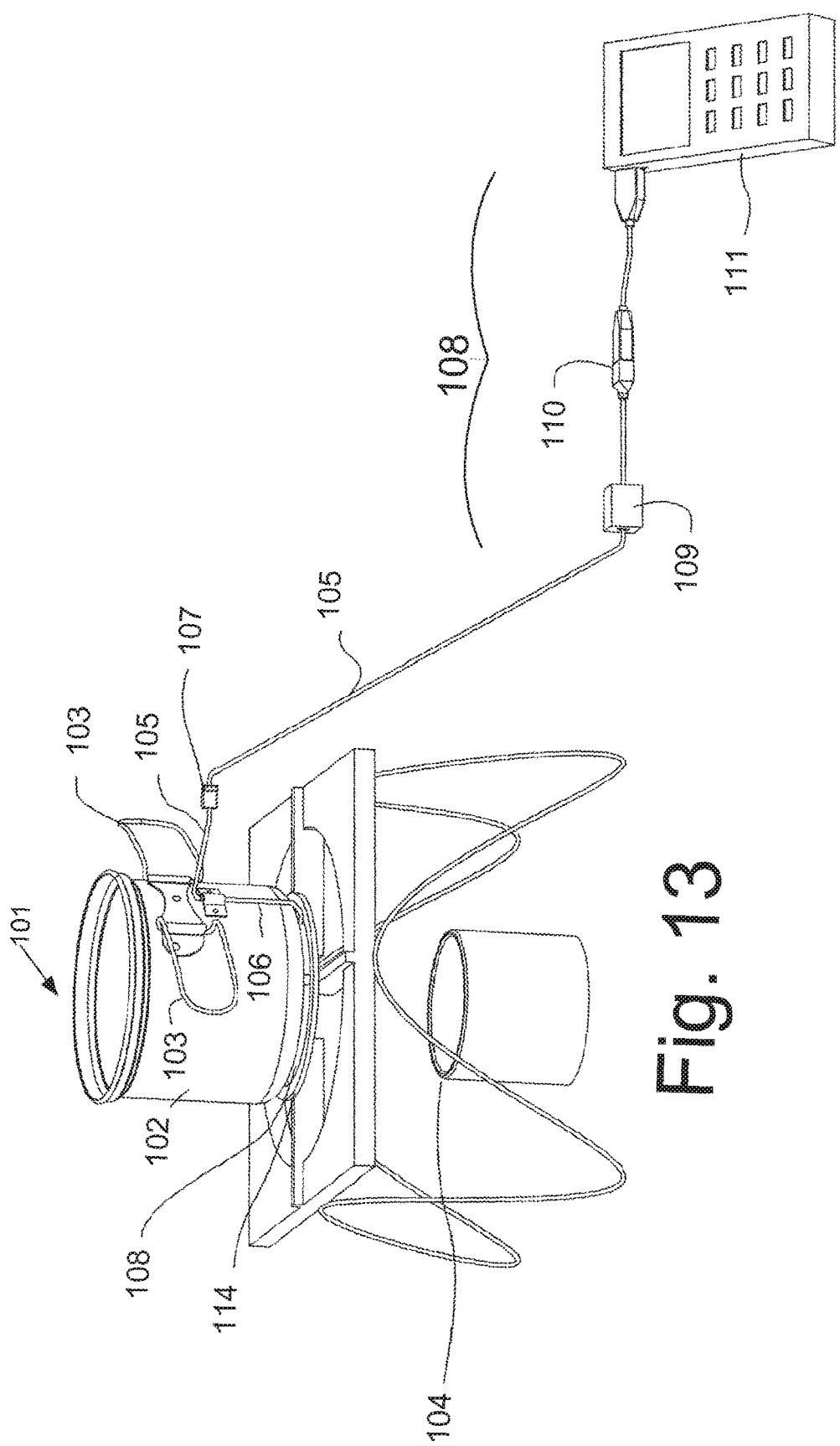

US 10,361,582 B2

POWER METERING AND CONTROL SYSTEM ADAPTABLE TO MULTI-STANDARD DEVICE

RELATED APPLICATIONS

This application is a continuation of U.S. patent application Ser. No. 14/109,332, filed 17 Dec. 2013, which is a continuation-in-part U.S. patent application Ser. No. 13/332, 237 filed 20 Dec. 2011, which claims priority to priority to U.S. Provisional Patent Application Ser. No. 61/425,699 filed Dec. 21, 2010. U.S. patent application Ser. No. 14/109, 332 also claims priority to U.S. Provisional Patent Application 61/738,345, filed Dec. 17, 2012, and claims priority to U.S. Provisional Patent Application 61/862,791, filed Aug. 6, 2013. U.S. patent application Ser. No. 14/109,332 also claims priority to U.S. Provisional Patent Application 61/879,987 filed 19 Sep. 2013. Priority is claimed to each of these applications and the entire contents of the aforementioned patent applications are incorporated herein by reference in their entirety.

FIELD OF THE INVENTION

The invention relates generally to the field of power-metered charging systems for devices configured to comply with multiple standards.

SUMMARY

According to an embodiment, an apparatus for charging a smart load is disclosed. The smart load is capable of receiving power at least at a first power-reception level and a second power-reception level. The second power-reception level is greater than the first power-reception level. The apparatus comprises a solar panel and a controller operably coupled to the solar panel. The controller is configured to monitor an amount of power received by the smart load when the smart load is in electronic communication with the solar panel. The apparatus includes a display configured to provide a visual representation of the amount of power. The apparatus further includes an interrupting device in communication with the controller. The controller is configured to cause the interrupting device to interrupt power flow to the smart load based on a determination that the smart load is receiving power at the first power-reception level. The smart load receives power at the second power-reception level in response to the interruption.

According to another embodiment, an apparatus for supplying power to a load comprises a solar panel and a connector operably coupled to the solar panel. The apparatus includes a monitoring device configured to periodically monitor a power-reception level of the load when the load is coupled to the connector. The apparatus includes a display comprising a light emitting diode. The display is configured to provide a visual feedback that represents the power-reception level.

According to another embodiment, an apparatus for charging a smart load capable of receiving power at a first power-reception level and a second power-reception level greater than the first power-reception level includes a solar panel and a connector operably coupled to the solar panel. The apparatus comprises a monitoring device configured to monitor a power-reception level of the smart load when the smart load is coupled to the connector. The apparatus includes an interrupting device. The interrupting device is configured to interrupt power flow to the smart load based on a determination that the smart load is receiving power at the first power-reception level. The smart load receives power at the second power-reception level in response to the interruption.

According to yet another embodiment, a method for optimizing charging of a smart load using a solar panel is disclosed. The smart load is capable of receiving power at least at a first power-reception level and a second power-reception level. The second power-reception level is greater than the first power-reception level. The method comprises the step of using a connector to couple the solar panel to the smart load, and the step of monitoring power supplied by the solar panel to the smart load. The method also includes the step of interrupting power flow to the smart load in response to a determination that the smart load is receiving power at the first-power reception level. The smart load receives power at the second power-reception level in response to the interruption.

BRIEF DESCRIPTION OF THE DRAWINGS

FIG. 5 is a perspective view of the Intuitive Power Display Human Interface device of FIG. 1.

FIG. 6 is a perspective view of the Intuitive Power Display Human Interface device of FIG. 2.

FIG. 7 is a perspective view of the Intuitive Power Display Human Interface device of FIG. 3.

FIGS. 9a-c are orthographic view of USB charging cables as part of the Intuitive Power Display Human Interface device according to several embodiments.

FIG. 11 depicts standard USB related connectors.

FIG. 13 is a perspective view of one embodiment of a portable thermoelectric power generation system in accordance with the teachings of the current invention;

DETAILED DESCRIPTION

Figure 1:
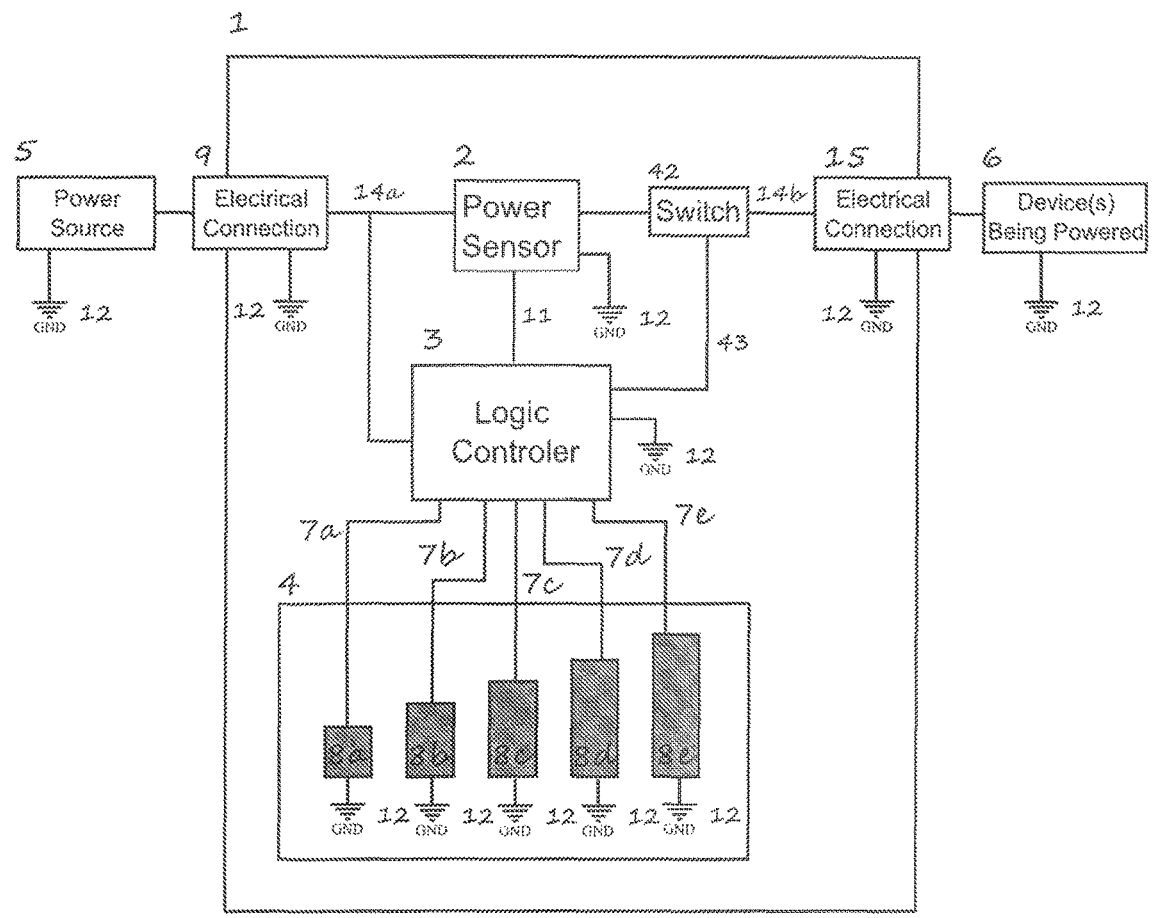
FIG. 1 depicts a conceptual layout of an embodiment of the invention.

A recent increase in battery powered mobile devices (cellphones, radios, lights, laptops, etc. . . . ) with relatively low power requirements (<100 W) has caused a rise in mobile methods of electrical power sources (e.g. batteries, solar panels, crank generators, thermoelectric generators, fuel cells). Simultaneously, connections for particular voltages have become globally standardized, such as USB (5V) and auto/marine outlets (12 V); however, electrical current and therefore power (P=V×I) is not similarly standardized for these same connections. For example, with the Universal Serial Bus (USB) connection there are three categories of USB 1.0, 2.0, and 3.0, each with their own specification, with three different maximum currents 500 mA, 1,000 mA, and 3,000 mA respectively, all of which are standardized at five volts. All three categories use 5V and are physically inter-connectable. The invention described herein provides, among other things, a simple, intuitive, cost effective means of determining the current/power being supplied through a voltage standardized port.

It is particularly useful to know the instantaneous current draw when charging a mobile device in the field from a portable generator due to the wide variety of current requirements of devices and output capabilities of generators. Many mobile devices will display "charging" when plugged into power sources that are inadequate to charge the device at the expected rate. For example, a tablet requiring 2,000 mA charging from a 400 mA hand-crank generator may display "charging" when plugged into the generator even though the generator does not provide enough power to charge the device. In the described scenario, it is most likely that the hand-crank will be incapable of increasing the battery charge of the tablet while the tablet is turned on (consuming 2 W<), though it may indicate active charging. When energy is scarce, having realistic expectations of charging times, and therefore running time, is extremely valuable.

Many power generation devices also have variable output. For example, a thermoelectric generator has output that depends greatly on a temperature difference between a heated surface and a cooler surface, if a campfire is used to heat the heated surface, the temperature of the heated surface will vary with many factors, including proximity and type of fuel, airflow, and stage of campfire, throughout the life of the campfire. Similarly, a solar panel has output that varies with time of day, angle to the sun, cloud, shade, latitude, and so forth.

However, the reverse scenario, i.e., when the mobile device consumes less power than available in the mobile generator, may also occur. For example, consider a mobile phone charging at 1,000 mA from a solar panel capable of outputting 2,000 mA. In this scenario the user could be charging 2 mobile phones or 1 larger battery capable of harnessing the full power output of the 10 W solar panel. Considering that batteries in mobile devices charge at different currents during different regimes of their charge cycle, the maximization of power usage from the source becomes increasingly complicated. Furthermore, with the increasing use of LED lighting, devices consuming <5 W are widespread, the possible combinations of devices consuming a total of <10 W (common voltages, differing currents) becomes staggering.

Additional benefits of an intuitive power display human interface device include its use maximizing the current output of a power generation system which can be affected with human intervention in accordance to the feedback from the power display. Many portable power sources, particularly generators, have power outputs that are dependent on the current local environment, and the user may make adjustments to either the generation system or the environment to influence the power output of the generator.

This may be illustrated by the case of a solar panel that is partially shaded or oriented non-optimally towards the sun. Without feedback the user will not know that the power output of the generator is very low, even though the device they intend to charge may indicate that it is in the charge state. Using the human interface device, the user knows the device is charging below specification, and may reposition the solar panel. During repositioning, the intuitive power display human interface device may actively display optimal positioning through increase of illuminated bars or improper positioning through decrease of illuminated bars. In bright sunlight, maximizing the visible shadow created by the solar panel is one means of determining the best position of the photovoltaic cell for maximum power output. The intuitive power display human interface device is particularly effective during overcast conditions when solar power is still available, but proper orientation is hindered by the lack of shadows. Additionally unseen shadows may be cast from trees, buildings, et cetera, which can drastically decrease the solar panel's output through shading of cells, within the module, from non-visible light (e.g. IR, UV).

Effects of environmental conditions on power supplies are not limited to solar panels. In the case of a thermoelectric generator, for example, the user may use the feedback from the intuitive power display human interface device to maximize the temperature difference of the system. This may be done by increasing the heat input, or decreasing the temperature of the heat-sink. The effectiveness of lithium-ion batteries is influenced by the local temperatures, particularly cold weather. Additionally, charge potential within the battery itself determines the ability of the unit to pass current to another device. Once the potential within the battery decreases to near zero, current will no longer be supplied to the desired devices, and the internal battery potential must therefore be established prior to continued use as a power supply.

Some USB devices, such as smart phones, are admittedly more sophisticated than others. Therefore, it is unsurprising that some devices have complicated charge controllers while others readily accept any available power. A prime example of this is in smartphones, which determine the state of the power source when initially connected. These devices check the data pins of the USB source, and attempt to draw the recommended amount of current (e.g. 50 mA, 500 mA, 1000 mA). If the power is available, it will draw the suggested amount of current. If the source is power starved, and the device is unable to draw the suggested current, then charging may continue at a reduced current or not at all, as decided by the particular charge controller. This feature is meant to increase the lifetime on the device batteries.

However, these complicated charging methods can have undesired effects when using a power source with output which varies with time (e.g. solar panel, thermoelectric generator) because the power state of the source may only be determined when the device is connected to the source. Therefore, if the environment of the generator improves and more power is available than when the device was initially connected, the device will not charge at a faster rate until the 'bus' is cycled by disconnecting and reconnecting the USB device.

Furthermore, if the power flow into a device with such an advanced charge controller is temporarily impaired the device charging will decrease to a nominally lower current flow, and not return to the desired maximum until the device bus is cycled. This phenomenon can cause drastically increased charge times from alternative generators, particularly solar panels. For example, if a smartphone is charging at 1 A (5 W) from a portable solar charger, and an obstruction comes between the panel and the sun (such as a cloud, leaf, person), diminishing the solar flux on the panel, the current flow will decrease accordingly; however, once the obstruction moves and full solar intensity is restored to the panel, the smartphone will continue charging at the decreased current until the bus is cycled.

Overall the addition of an intuitive power display human interface substantially increases the user's knowledge and helps the user to have empirically derived understanding about the overall state of power transmission in the system it is used with and thereby can increase the overall usability of said power source. Because of the relative simplicity of the interface display and the highly intuitive nature of an additive interface display scheme, a large number of people with diverse cultures, languages, and educational levels will be able to fully utilize the power source it is used in conjunction with.

The present invention is, among other things, an intuitive means of displaying power. More specifically, the human interface device may be used with a standard connection to display instantaneous electrical power passing from an electrical supply to an electrical device. The display uses conceptual rather than explicit numeral depiction of the power such that an individual untrained with the intuitive power display human interface device (IPDHID) may easily interpret the amount of power, in a relative sense. The conceptual display of power without use of numbers may readily be achieved via a plurality of similar symbols of increasing size or brightness. An analogous display system is currently implemented globally to depict signal strength of wireless technologies.

Thermoelectric generators present a promising alternative to portable power-generation needs because of their ability to generate power under any scenario where a heating and cooling source is available. Thermoelectric generators harness the offset from equilibrium created by a temperature differential across dissimilar conductors, and convert this temperature difference directly into usable electrical power. The amount of electrical power generated by means of a thermoelectric generator is proportional to the temperature difference across the dissimilar conductors.

Thomas J. Seebeck discovered thermoelectric power in 1821, and the conversion of temperature differences directly into electricity is appropriately known as the Seebeck effect. To realize a true thermoelectric device, both n-type and p-type materials are electrically coupled to complete a circuit. Jean-Charles Peltier discovered the presence of heat at an electrified junction of two dissimilar metals in 1834. The combination of the Seebeck and Peltier effects is known as the Thompson effect (after William Thomson-Lord Kelvin), who observed both phenomenon occurring simultaneously in 1851. By using these fundamental principles, thermoelectric devices can be created that, upon the application of power, cool from one side and emanate heat from the other; or, which generate power when one side of the device is cooled and the other side is simultaneously heated.

Bismuth telluride ($Bi_2Te_3$) is one of the most common thermoelectric materials in use today due to its relatively high efficiency and material availability. Thermoelectric modules containing $Bi_2Te_3$ may be purchased from a variety of manufacturers around the world. Bismuth telluride may be made p-type or n-type by introducing impurities of antimony or selenium, respectively. Bismuth telluride thermoelectric generation modules (TEGM) may comprise n-type and p-type doped legs which are electrically joined in pairs, each of which may generate ~150 µV. These pairs are then connected in electrical series to raise the voltage. The number of pairs of legs connected in the series determines the relative output voltage of the module at a given temperature differential. These modules may be connected in electrical series or parallel to form a thermoelectric generator system (TEGS). The output characteristics of the TEGS will follow the same general principals as just outlined for module assembly from thermoelectric legs.

The output characteristics of a given thermoelectric generator may be matched to the desired load for the TEGS. Many portable generators on the market today have standard output(s) such as USB or 12V auto/marine socket. Generally speaking, the closer the output voltage and current are matched to the requirements of the load, the less power will be lost during voltage regulation which is necessary to achieve stable standard output voltages such as 5V for USB and 12V for auto/marine. Voltage regulation is described in more depth elsewhere in the description of the invention.

Photovoltaic (PV) generators, or solar panels, have been used for portable and remote power generation for several decades. PV solar panels create DC electrical power directly from sunlight with no moving parts. Today, small solar panels (<100 W) come in many form factors and are widely used to power electronic devices such as cellphones, lights, batteries, laptops and more. With advances in technology and market size, PV generators have become economical for a global market. In highly developed economies, personal solar panels (1-10 W) have become particularly abundant in the outdoor activity and emergency preparedness markets for powering personal electronic devices including cameras, smartphones, MP3 players, radios and more. In developing economies, such as those found across most of the African continent, personal solar panels have become an integral part of society. In these developing nations personal solar panels often offer the sole source of electrical power, and are a main source of power for charging cell phones and other portable electronics. This allows the owner of personal solar panels not only to power the electronics of their home/family, but also to sell power from these personal solar panels to friends and neighbors, particularly for phone charging.

Solar panels are made of solar modules which are in-turn made of solar cells. Solar cells are semiconductors which produce electrical power when illuminated. Illumination causes electrons to be promoted from a lower energy band, within the solid, to a higher band, across a band-gap. When this electron, negatively charged, is promoted to a high band, a hole, or positive charge, is left in the lower band. This electron/hole pair is commonly known as an exciton. Excitons are separated within the solar cell through a built in potential, or voltage, which causes the flow of electrons toward to positive potential side, and the holes move oppositely toward the negative potential. The potential is built in to the surface of the solar cell through creating a P-N junction in the semiconducting material. By this means, electrical current, and therefore power, is created when the solar cell is attached to a load, completing a circuit. The amount current generated may depend on many variables, of which the amount of illumination, or solar/luminous flux, as well as the efficiency of the solar cell. The voltage is primarily dependent on the material of the cell, affecting the band-gap, as well as the construction of the modules and panel.

Solar cells are most commonly made of silicon, although there are many other semiconductor materials capable of producing solar cells including: Gallium Arsenide (GaAs), Cadmium Telluride (CdTe), Germanium (Ge), Copper Indium Gallium diSelenide (CIGS), and more. All of these materials have different band gaps, and therefore different output voltages from the solar cells. For example, the band gap of GaAs is 1.4 eV whereas the band-gap of Silicon is 1.1 eV. Several allotropes of silicon can be used for photovoltaic power generation, including monocrystalline Silicon (mono-Si), polycrystalline silicon (poly-Si), and amorphous Silicon (a-Si), all of which have slightly differing band-gaps due to differences in their crystalline structure.

It is also known that solar cells have nonlinear current versus voltage characteristics, because of the P-N junction creates a diode. Since electric power (P) is equal to the voltage (V) multiplied by the current (I), V*I=P, and the output of a solar panel is nonlinear, there exists a maximum power point which is not at half the short circuit current or open circuit voltage. This power point can differ between solar cells, and is strongly affected by the quality of the P-N junction of the particular solar cell and available light.

Solar cells may be connected in series to form a module. This module will have output characteristics which depend on the quality, material, and number of cells. For example, for a silicon module with 6 cells in series the nominal open circuit voltage will be 1.1V*6=6.6V. As the cells are connected in series, and the current through all cells must be the same, the current will be limited to that of the lowest output cell. These modules may be connected in electrical series or parallel to form an array. The output characteristics of the array will follow the same general principals as just outlined for module assembly from cells.

The output characteristics of a given solar panel may be matched to the desired load for the solar panel. Many solar panels on the market today have standard output(s) such as USB or 12V auto/marine socket. Generally speaking, the closer the output voltage and current are matched to the requirements of the load, the less power will be lost during voltage regulation which is necessary to achieve stable standard output. Voltage regulation is described in more depth elsewhere in the description of the invention.

Electrical power storage through means of an electrochemical cell, or battery, is one of the oldest methods of electrical power. Battery chemistries include lithium/carbon, nickel metal hydride, nickel cadmium, zinc air, lead acid, and more. These batteries power personal electronics, automobile starters, and more.

Each battery chemistry has its particular cell potential, or voltage, which changes depending on charge state of the battery. Several cells may be combined in series or parallel to achieve the desired output voltage and current. For example, a lead acid battery has a cell voltage of 2.1 V whereas lithium-ion batteries have a typical cell voltage of 3.7 V, depending on the cathode material. Standard auto/marine batteries, (12 V auto/marine cigarette socket standard connection), use 6 lead acid cells in series, for a nominal voltage of 12.6 V (6*2.1V=12.6V). Each battery chemistry may have its particular advantage or disadvantage for a given application. Characteristics which may vary between cell chemistries include: cell voltage, maximum charge/discharge currents, environmental concerns such as toxins and acids, energy density, cost, and many more.

In the previous decade, lithium based batteries have seen a particular increase in production and market penetration. This increase in lithium batteries is primarily due to the high energy storage density allowing lithium batteries to accommodate the increasingly small size of electronic devices. This high energy density comes from the small size and weight of the lithium ion, and the relatively large cell potential of ~3.7 V. Additionally, with a cell potential of 3.7 V, a single cell lithium battery integrates well with the USB standard of 5V. Single cell lithium batteries may fully charge from a USB port since 5 V is higher than 3.7 V. It is important to regulate the charging of a battery, so as not to surpass charging current/voltage limits which may damage or destroy the battery. These charge controllers are commonly built either into the device or into the battery.

The output characteristics of a given battery may be matched to the desired load for the battery pack. Many battery packs on the market today have standard output(s) such as USB or 12V auto/marine socket. Generally speaking, the closer the output voltage and current are matched to the requirements of the load, the less power will be lost during the voltage regulation necessary to achieve stable standard output. Voltage regulation is described in more depth elsewhere in the description of the invention.

Voltage regulation circuits are commonly used in electronic devices, and are readily available on the market. For example, any electronic device with a battery will have a regulation circuit for the battery in order to provide the correct charging voltage, prevent over charging, and more. Additionally, battery powered devices often have voltage regulators on the output of the battery in order to provide the electronics within the device the correct and stable voltage. Those skilled in the art know there are many methods of regulating voltages, which may be as simple as a resistor or complicated as high frequency switching circuits.

There are three general types of voltage regulators: those which increase (boost) a lower voltage to a higher voltage, those which decrease (buck) a higher voltage to a lower voltage, and those which can both buck and boost an input voltage to given output voltage. Within these three categories many topologies of circuits may exist, such as: SEPIC, CUK, Split-Pi, linear, and more.

Voltage regulators are ubiquitous in mobile charging systems, because there are so many personal devices which charge from standard outputs, such as 5V USB and 12V auto/marine. When designing a mobile charging system, one or more of the above regulators may be required depending on the power source and the device being powered. For example, a thermoelectric generator may require a buck/boost regulator. The output voltage from the TEGS may be above the desired user voltage when the TEGS starts operation, and as time progresses the TEGS output voltage decreases below the desired user voltage as the temperature differential decreases. On the other hand, solar panels may use a buck regulator, since the output voltage of the array is always higher than the desired user voltage. However, boost regulators are used in a portable single cell lithium battery pack for charging USB devices to take the voltage of the lithium cell (3.7V) to the 5V required for the USB standard.

The presence of mobile communication technology in the form of cellular phones and "smart" phones has grown rapidly over the past 2 decades, and is now believed to have a global market penetration of nearly 90%, equaling over 6 billion users. Recently, as well as in the foreseeable future, the most growth is from developing economies such as India and much of Africa, where limited access to an electrical grid exists. In these regions infrastructure development has been unable to keep up with population growth/movement, and vital tasks, such as personal banking, are performed using cellular phones. Due to the enormous size of the cellphone/smartphone market, it is unsurprising that there exist many manufacturers of these devices including Apple, Samsung, Nokia, HTC, LG, ZTE, Motorola, Huawei and more.

Though operating principles between different makes of mobile phones are generally similar, the hardware interface for charging the internal battery remains largely proprietary to specific makes/brands. For example, Apple currently uses an eight pin "lightning" connector for its mobile technology, while the major market competitor, Android, charge primarily from the 5 pin USB-micro connector. Both of these connector types are built for the USB 2.0 standard, meaning both operate at 5 Volts and 0-1 Amps; however they are physically incompatible with one another's devices. Similarly, Nokia, Motorola and Samsung may all use different charging connector than the two previous examples.

Moreover, the voltage on the data pins of the USB connector, which a charging cable may be plugged into, may affect the charging rate of the connected device. For example, with Apple devices it is customary to for USB-pin-2 to be 2.65 V and USB-pin-3 to be 2.05 V on the source to enable 1 A charging, else the device may charge at decreased rate such as 500 mA. However, with Android devices charging from USB-micro connectors, it is customary to short USB-pin-2 to USB-pin-3 to enable 1 A charging, else the device may charge at decreased rate such as 500 mA. Other USB devices may have different requirements of the source data pin voltages to enable fast charging of the device.

Universal Serial Bus or USB may not be as universal as the name implies, because of the vast number of devices with their differing charging standards as described above. Though all the described devices may charge from the same given USB port, differing charging results for each device may be experienced by end user, often unknowingly. The described invention allows the end user to know the amount of power being transferred into their device while charging from a universal port, through an intuitive LED based display. This allows the user to troubleshoot charging problems, and may help achieve the most desired charging results.

As seen in FIG. 1, the intuitive power display human interface device 1 comprises a power sensor 2, a logical interface controller 3, and an interface output device 4. The power meter operates by measuring the flow of current from power source 5, using power sensor 2, into device(s) being powered 6. The human interface output device 4 may comprise a plurality of individually electrically addressed human interface output devices 8 controlled by electronic switches 7 in the logical interface controller 3.

According to one embodiment, electrical power from the power source 5 enters the IPDHID 1 through an electrical connection 9 and continues to the power sensor 2. The power sensor 2 supplies the logic controller 3 with a reference signal 11. This reference signal 11 conveys the power flow from the source 5 to the device 6 to the user of the system 1 by means of the interface output device 4. The amount of power flowing from the source 5 to the device 6 through the IPDHID 1 may be discreetly displayed 8 in the human interface output 4 by use of the logic controller 3. The logic controller 3 receives the reference signal 11 from the power sensor 2. The logic controller 3 then outputs discrete signals 7 to the discrete components 8 of the human interface display 4. When the amount of power flowing from the source 5 to the device 6 through the system 1 varies, the reference signal 11 also varies in similar proportion to the change of power flow from 5 to 6 and in-turn the change in power flow is shown to the user of system 1 through a change in discretely illuminated parts 8 of the human display 4.

When implemented by an individual skilled in the art, the system 1 consumes orders of magnitude less power than is being supplied from the source 5 to the device 6. This is due to the fact that power sensors 2, logic controls 3 and methods of displaying discrete power 8 are increasingly efficient, and operate with only milliwatts of power. Therefore, when properly designed, the power diverted 13 to operate the logic controller 3 and display 4 is much less than the power supplied 14a from the source 5. This being said, the power 14a from the source 5 entering the system 1 through the electrical connection 9 is approximately (within 1%) equal to the power 14b leaving the system 1 through the electrical connection 15 to the device 6. In order to preserve the flow of electrical current the power source 5 the IPDHID system 1 and the device 6 share a common ground 12.

In a potential embodiment, it may be desirable to include a switch 42 to interrupt the power 14b leaving the system 1 into the device 6. The switch 42 may be controlled by the same logic controller 3 as is used to control the display elements 8, by means of a signal 43. Such a method may result in small additional cost of the IPDHID 1 for the additional functionality. When activated, the switch 42 effectively disconnects the device 6 by interrupting the power 14b being supplied to the device 6. After the power 14b is interrupted for some amount of time (e.g. 0.5-5 seconds) the controller 3 again sends a signal 43 to the switch 42 which reestablishes the flow of power 14b from the source 5 to the device 6 through the IPDHID 1. In this way, the system 1 may effectively cycle or reset the 'bus' of the device 6 automatically, without the need of user intervention to physically disconnect the device 6 from the source 5 or IPDHID 1. The conditions which will cause the activation of the switch 42 may be programmed into the logic controller 3. The addition of an automatic bus cycling feature may be particularly desirable when using a nonstandard power source 5 such as a portable solar panel, as earlier described.

The intuitive power display human interface device 1 may be very physically minute. This is due to the operational simplicity of the system and the wide commercial availability of extremely small package sizes of microelectronic controllers suitable for use as the logical interface controller 3. For example, one such device is only 2 mm by 2 mm. The low physical extent in volume and footprint as well as the operational simplicity and small part count allow for production of system 1 at low economic cost. In a potential embodiment, system 1 may be embedded in a wide variety of power generation systems 5 or power transmission systems without significantly increasing the size or cost in contrast with comparable a cable or system without the system 1.

Figure 2:
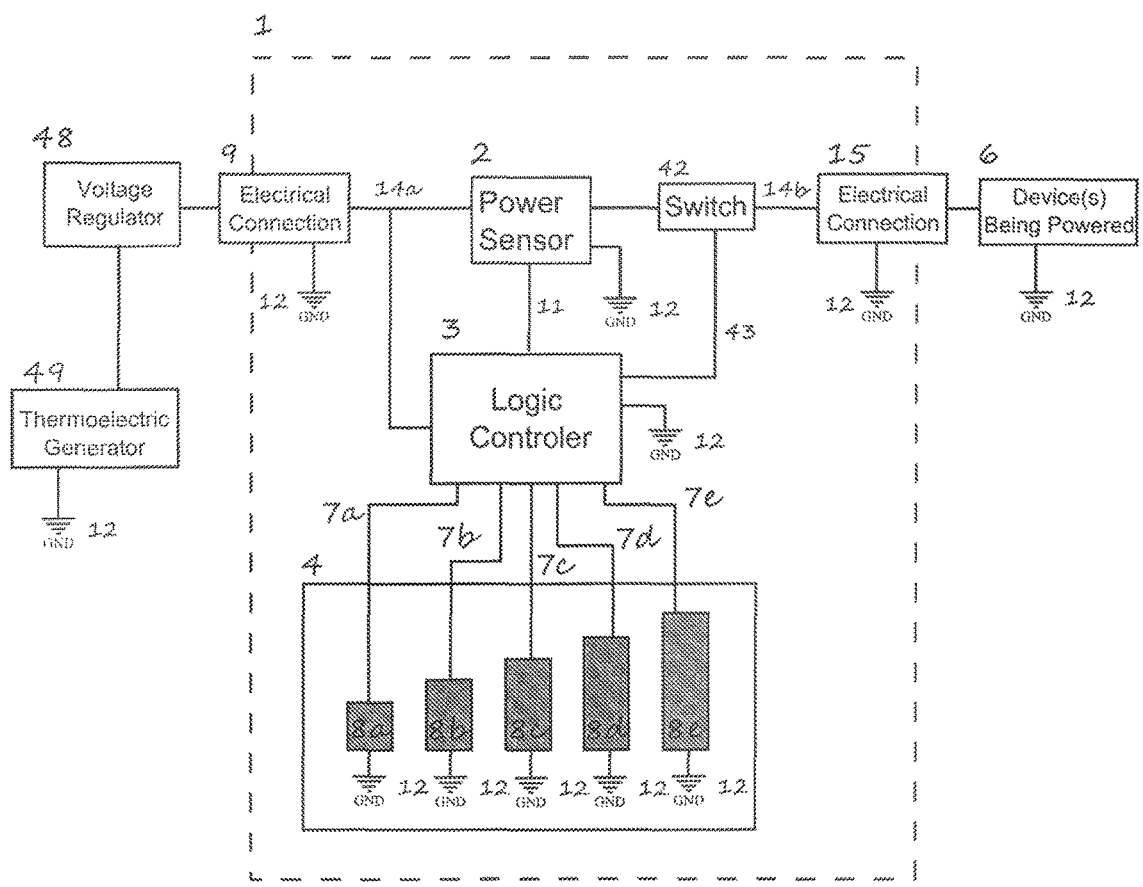
FIG. 2 is a detailed circuit diagram of one embodiment of the invention.

FIG. 2 shows an embodiment of the system 1 using a thermoelectric generator (TEG) 49 as the power source 5, seen in FIG. 1, to power the device(s) 6. The TEG 49 creates power proportional to the applied temperature differential, and may require a voltage regulator 48 to properly power the device 6. Power may be supplied 14a to the power sensor 2 and logic controller 3 via an electrical connection 9. All parts of the system 1 may share a common ground 12 as well as TEG 49 and device 6. In proportion to how much power is being transferred from the TEG 49 to the device 6, a signal 11 may be sent from the power sensor 2 to the logic controller 3 which may in turn send signals 7a,b,c,d,e activating the corresponding discretely illuminated parts 8a,b,c,d,e of the display 4. The logic controller 3 may also send a signal 43 to a switch 42 to interrupt the power flow 14b to the electrical connection 15 and the device 6. The logic controller 3 may again send a signal 43 to a switch 42 reestablishing the power flow 14b to the electrical connection 15 and the device 6. This action affectively cycles the bus power of the device 6, which may be required due to power output fluctuations of the TEG 49. The voltage regulator 48 may be built into system 1 with an internal electrical connection 9 which may be made by means of solder and PCB traces. Conversely, the voltage regulator 48 may already be present with the TEG 49.

Figure 3:
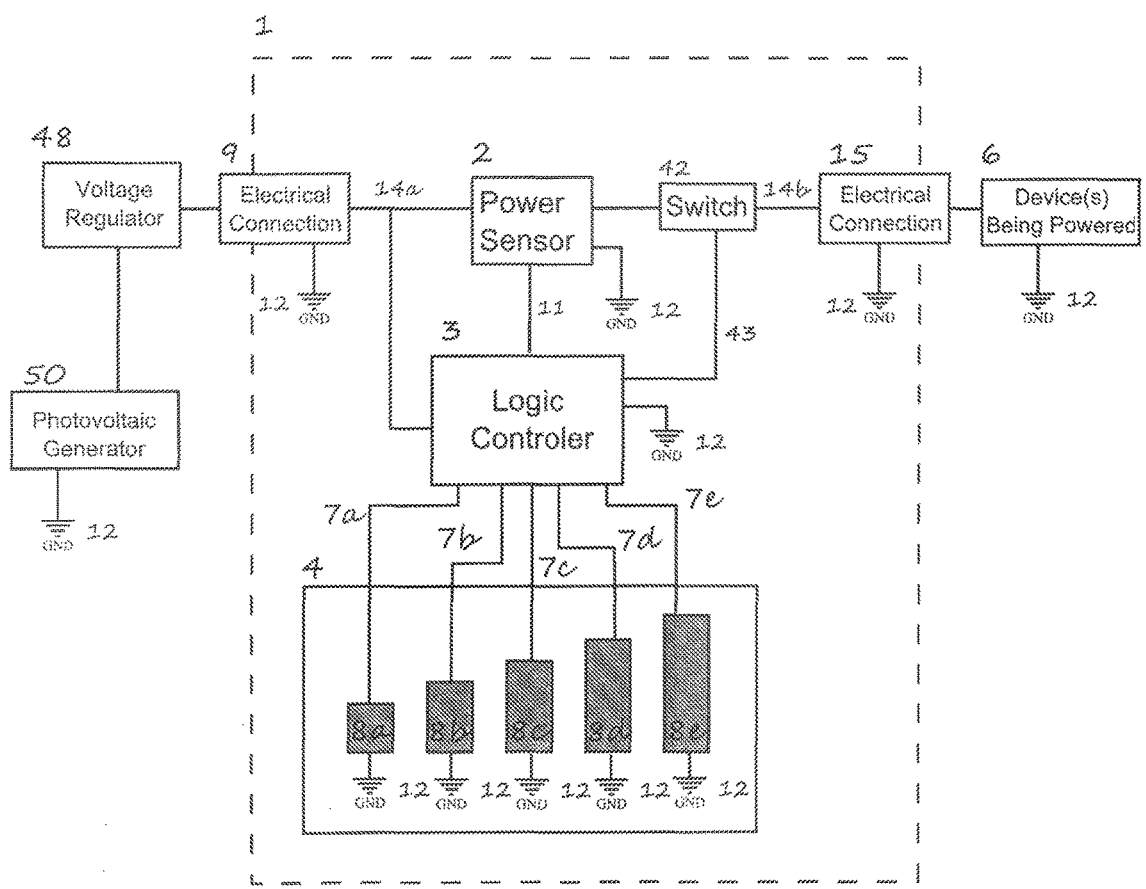
FIG. 3 is a detailed circuit diagram according to another embodiment of the invention.

FIG. 3 shows another embodiment of the system 1 using a photovoltaic (PV) generator 50 as the power source 5, seen in FIG. 1, to power the device(s) 6. The PV generator 50 creates power proportional to amount of luminous flux, and may require a voltage regulator 48 to properly power the device 6. Power may be supplied 14*a* to the power sensor 2 and logic controller 3 via an electrical connection 9. All parts of the system 1 may share a common ground 12 as well as PV generator 50 and device 6. In proportion to how much power is being transferred from the PV generator 50 to the device 6, a signal 11 may be sent from the power sensor 2 to the logic controller 3 which may in turn send signals 7*a,b,c,d,e* to activate the corresponding discretely illuminated parts 8*a,b,c,d,e* of the display 4. The logic controller 3 may also send a signal 43 to a switch 42 which interrupts the power flow 14*b* to the electrical connection 15 and the device 6. The logic controller 3 may again send a signal 43 to a switch 42 reestablishing the power flow 14*b* to the electrical connection 15 and the device 6. This action affectively cycles the bus of the device 6, which may be required due to power output fluctuations of the PV generator 50. The voltage regulator 48 may be built into system 1 with an internal electrical connection 9 which may be made by means of solder and PCB traces. Conversely, the voltage regulator 48 may already be present with the PV generator 50.

Figure 4:
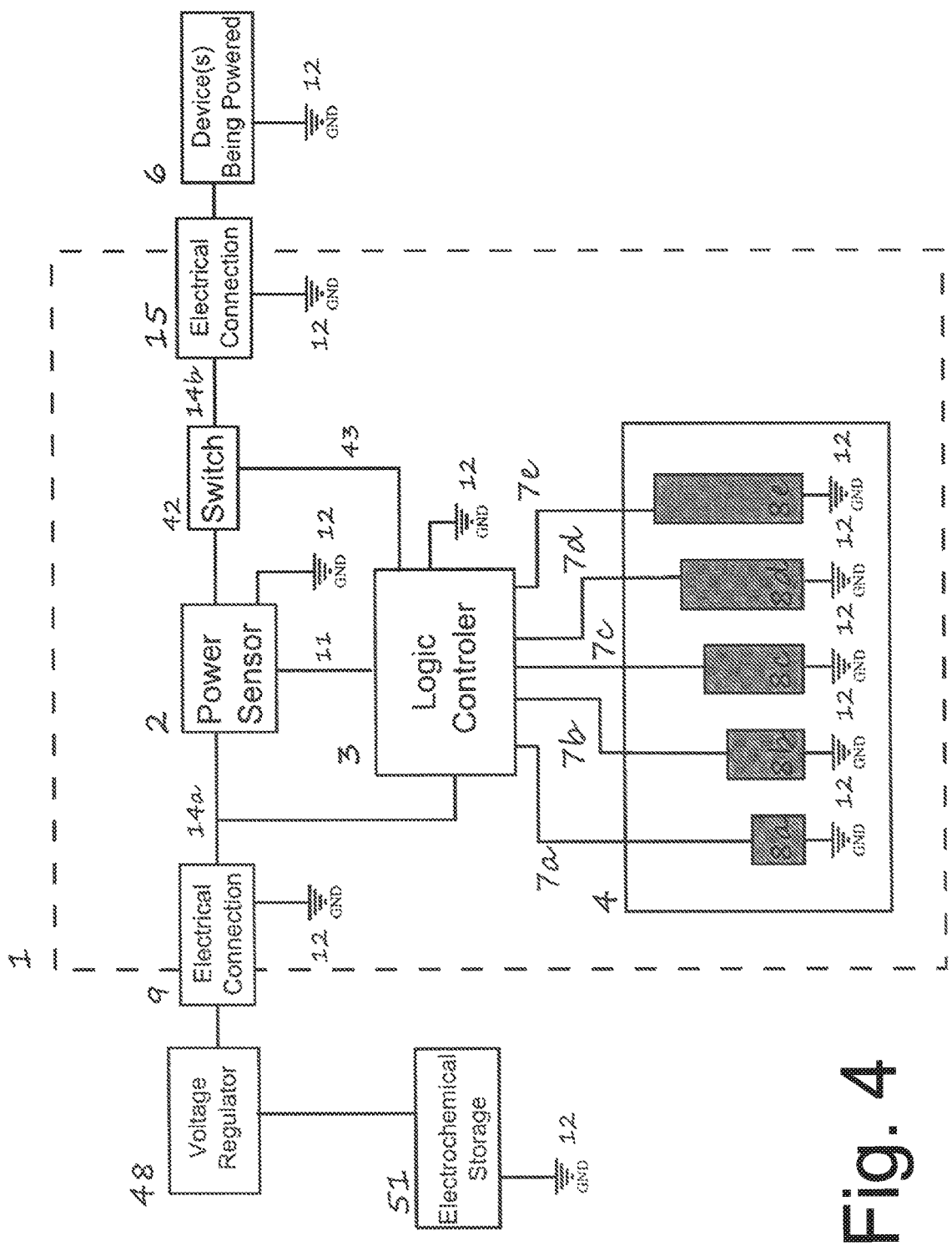
FIG. 4 is a detailed circuit diagram according to another embodiment of the invention.

FIG. 4 shows another embodiment of the system 1 using electrochemical storage 51 as the power source 5, seen in FIG. 1, to power the device(s) 6. The electrochemical storage 51 creates power proportional to electrochemical potential, and may require a voltage regulator 48 to properly power the device 6. Power may be supplied 14*a* to the power sensor 2 and logic controller 3 via an electrical connection 9. All parts of the system 1 may share a common ground 12 as well as electrochemical storage 51 and device 6. In proportion to how much power is being transferred from the electrochemical storage 51 to the device 6, a signal 11 may be sent from the power sensor 2 to the logic controller 3 which will in turn send signals 7*a,b,c,d,e* to activate the corresponding discretely illuminated parts 8*a,b,c,d,e* of the display 4. The logic controller 3 may also send a signal 43 to a switch 42 which interrupts the power flow 14*b* to the electrical connection 15 and the device 6. The logic controller 3 may again send a signal 43 to a switch 42 reestablishing the power flow 14*b* to the electrical connection 15 and the device 6. This action affectively cycles the bus of the device 6, which may be required due to power output fluctuations of the electrochemical storage 51. The voltage regulator 48 may be built into system 1 as part the electrochemical storage device 51 with an internal electrical connection 9 which may be made by means of solder and PCB traces. Conversely, the voltage regulator 48 may already be present within the electrochemical storage 51.

FIG. 5 shows another embodiment of the system 1. In this embodiment the IPDHID system 1 is a discrete unit placed in-line between the power source 5 and the device being powered 6. In the described embodiment, the power source 5 connects to the system 1 through a standard USB A male receptacle 9 mounted to the printed circuit board (PCB) 10. Through the PCB 10 the power source 5 connects to the device 6 by means of the USB A female receptacle 15. Also connected to the PCB 10 may be the power sensor 2, the logical device 3, and the light emitting devices 16. Through the PCB 10 the power sensor 1 relays the reference signal 11 to the logic device 3. In-turn the logic device 3 relays discrete signals 7 to the discrete light emitters 16 illuminating the discrete power display 8 of the human interface 4 in proportion to the power flow from the source 5 to the device 6, as shown in FIG. 1.

The embodiment of system 1 as shown in FIG. 5 allows the user to know the approximate amount of power being transferred from the USB power source 5 to the USB device 6 through the power discrete display 8 of the human interface 4. In this embodiment, the power discrete display 8 is segmented into five discretely illuminated units with corresponding power amounts set by the programming of the logic device 3. For the described embodiment, intuitive power display increments 8 may correspond to either 1 watt or 2 watts of electrical power passing from the power USB source 5 to the USB device 6 through the system 1, depending on whether the logic controller 3 is programmed for USB 2.0 (1 A*5V=5 W/5 increment=1 W/increment) or USB 3.0 (2 A*5V=10 W/5 increment=2 W/increment) respectively.

FIG. 6 shows another potential embodiment of the system 1, which uses a TEG 49 as the power source 5. In this embodiment, a voltage regulator 48 for the TEG 49 has been built in to the system 1. The power from the TEG 49 may be necessarily regulated to 5V by the voltage regulator 48 for the standard USB output connection 15. The amount of power transferred from the TEG 49 out the electrical connection 15 may be displayed via discrete LED lights 8*a,b,c,d,e*.

FIG. 7 depicts another potential embodiment in which the IPDHID 1 is built into a PV generation 50 system with a 5V USB output connection 15. The human interface display 4 may be made of discrete illumination elements 8*a,b,c,d,e* which give user feedback on how much power is being transferred from the PV generators 50 out of the electrical connection 15.

Figure 8A:
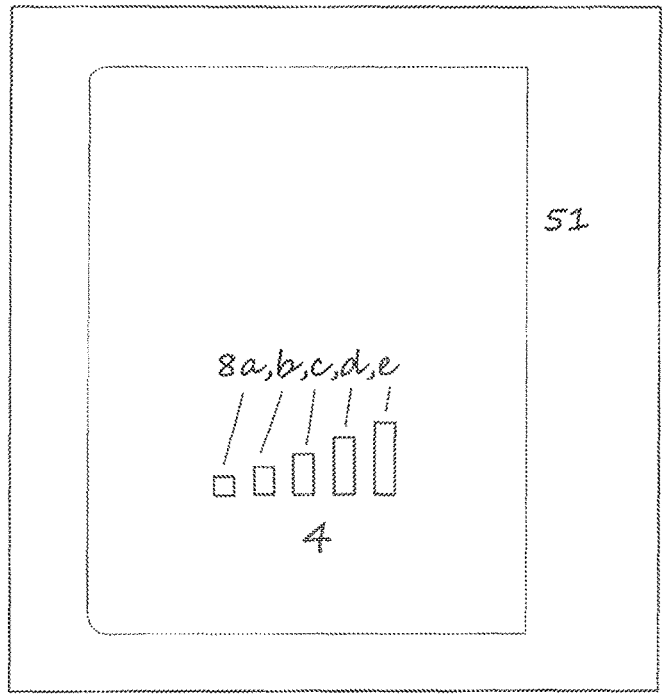
FIGS. 8A and 8B are top views of the Intuitive Power Display Human Interface device of FIG. 4 as installed in an assembly.
Figure 8B:
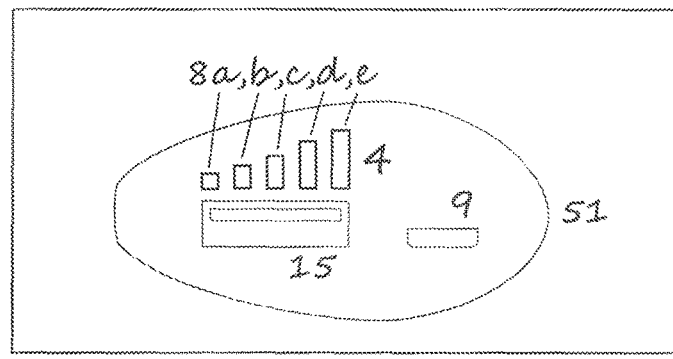

Shown in FIG. 8 is another embodiment of the IPDHID 1 which is built in with an electrochemical storage device 51. A human interface display 4 may display the amount of power being transferred from the electrochemical storage device 51 to the device 6 being powered. FIG. 8*a* shows a top down view of one embodiment of an electrochemical storage device 51 with a human interface display 4 comprised of discrete illumination elements 8*a,b,c,d,e*. The electrical input connection 9 and output connection 15 is not visible from this projection, and may be located on a side of the electrochemical storage device 51. FIG. 8*b* shows a front on view of another embodiment of an electrochemical storage device 51 with a human interface display 4 comprised of discrete illumination elements 8*a,b,c,d,e*. In this embodiment, the human interface display 4 may be located directly above a 5V USB connection 15. Also visible in FIG. 8*b* is an electrical input connection 9, which may be a 5V USB-micro.

FIG. 9 illustrates another embodiment of the IPDHID 1 which has been built into cable with a standard input connection 9 and 3 different output connection 15 types. FIG. 9*a* depicts the IPDHID 1 with discrete illumination parts 8*a,b,c,d,e* built into the end with the standard input connection 9 and three example output connections 15. FIG. 9*b* depicts the IPDHID 1 with discrete illumination parts 8*a,b,c,d,e* built into the middle of a cable with a standard input connection 9 and three example output connections 15. FIG. 9*c* depicts the IPDHID 1 with discrete illumination parts 8*a,b,c,d,e* into three examples of output connections 15 of a cable with a standard input connection 9.

Figure 10:
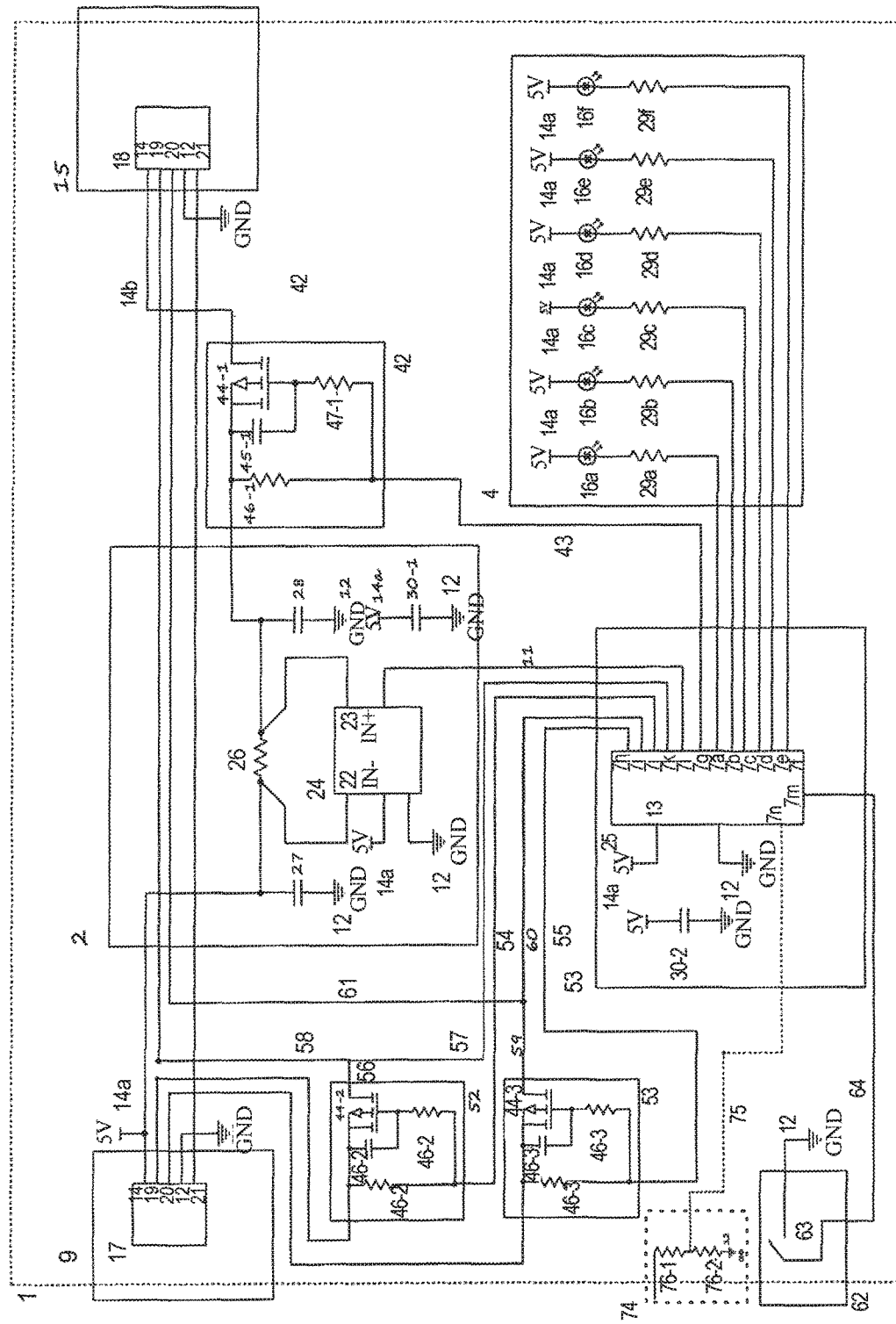
FIG. 10 is a detailed circuit diagram according to one embodiment of the invention.

FIG. 10 is a detailed circuit diagram of a potential embodiment as similarly described in FIGS. 1-9. The power and/or data enters the system 1 by means of the external connector 9, which in the described embodiment is a Male USB A connector 17 consisting of 4 pins 14, 19, 20, 12 and a cover shield connection 21. Electrical power is transmitted via the Male USB A connector 17 to the PCB 10 and the electrical circuits contained therein through pins 14 and 12 respectively. Data which may come from the source 5 is passed through to PCB 10 to the device 6 through the female USB A connector 18 along data connections 19 and 20 without alteration. In this embodiment of the invention, after power passes into the circuits of the PCB 10 a relatively small amount of power from 14*a* is drawn through 13 to power the interface display 4, power sensor 2, and logic controller 3. In this embodiment, functions of power measurement 2 and logical control 3 sub-systems of 1 are fulfilled by two microelectronic packages: a micro-current-sense amplifier 24 is used to accurately measure current making it analogous to the power sensor 2, and a programmable logic controller 25 which both calculates power from the measured current and may be programmed to appropriately control the human interface output display 4. In actuality the small amount of current, and therefore power, drawn through 13 is connected to 24 and 25 in parallel with power stabilizing and noise filtering capacitors 30.

Current flowing from 17 to 18 via 14*a* flows through a small (0.0200 Ohms) accurately known (+/−0.1%) electrical resistor 26 en-route to 14*b*. The voltage developed across the resistor 26 may be measured by the integrated circuit 24 using the input measurement pins 22 and 23. Capacitors 27 and 28 are coupled in parallel to circuit segments 14*a* and 14*b* respectively to stabilize the electrical character, namely voltage across 26. The voltage measured across the resistor 26 is amplified by 24 and transmitted to the programmable microcontroller 25 via 11. The program stored in the microcontroller 25 calculates the current flowing through the resistor 26 from the voltage signal from 24 and because it is itself connected to 14 via 13 as well as to the ground electrical network 12 it can also measure the voltage between 14 and 12. With both voltage and power measured, the microcontroller 25 can calculate a value for instantaneous power transmission from 17 to 18 using the relationship Power=Voltage*Current. The programmable microcontroller 25 illuminates elements 8 of the human interface display 4 using illumination producers 16 that may be discretely addressed using the general purpose analog outputs 7 of the logical control device 3, in this embodiment the microcontroller 25. The power consumption of the illumination producers 16 are limited by electrical resistors 29. The brightness of the illumination producers 16 can be adjusted down from the maximum rated brightness by increasing the value of 29. The program of the microcontroller 25 in the above described embodiment illuminates display segments 8 of the human interface display 4 in congruence with the conceptual display of power symbols of increasing size. In the case where the power measured from 17 to 18 is greater than zero (0.1 W) but less than 1.4 W the microcontroller 25 may close the circuit from 7*a* through illumination provider 16*a* and human interface display 4 element 8*a* will be illuminated. In the case where the power measured from 17 to 18 is between 1.5 W and 2.5 W the microcontroller 25 may close the circuit elements 7*a* and 7*b* through illumination providers 16*a* and 16*b* and human interface display 4 elements 8*a* and 8*b* will be illuminated. In the case where the power measured from 17 to 18 is between 2.5 W and 3.5 W the microcontroller 25 may close the circuit elements 7*a,b,c* through illumination providers 16*a,b,c* and human interface display 4 elements 8*a,b,c* will be illuminated. In the case where the power measured from 17 to 18 is between 3.5 W and 4.5 W the microcontroller 25 may close the circuit elements 7*a,b,c,d* through illumination providers 16*a,b,c,d* and human interface display 4 elements 8*a,b,c,d* will be illuminated. In the case where the power measured from 17 to 18 is greater than 4.5 W the microcontroller 25 will close the circuit elements 7*a,b,c,d,e* through illumination providers 16*a,b,c,d,e* and human interface display 4 elements 8*a,b,c,d,e* will be illuminated.

The switch 42 is comprised of a number of elements which use the signal 43 from the logic controller's 3 output 7*g* to interrupt or establish power flow 14*b* from the source 5 to the device 6 through the IPDHID 1. One component is a p-channel field effect transistor (PFET) 44, which are widely available on the market. Those skilled in the art will note that the use of PFETs may be preferable because the native state of this device normally allows conduction between source and drain without requiring a signal, analogous to a normally on momentary mechanical switch. To construct the switch 42 with a PFET 44, supporting components such as a stabilizing and decoupling capacitor 45 and voltage divider resistors 46, 47 may be necessary. The stabilizing capacitor 45 stabilizes the power flow through the PFET 44 and electrically decouples the gate input from the source, protecting the PFET 44 and adding to the overall reliability of the system 1. The voltage divider may be comprised of resistors 46 and 47 to provide the necessary voltage to flip the internal field within the PFET 44 from the signal 43 which determines whether the switch 42 is on or off.

Additional switches 52 and 53 may be used to control the data lines 19, 20 of the USB connections 9, 15 and may function similarly to switch 42. The microcontroller 25 can provide signals 54, 55 from general purpose analog outputs 7*h*, 7*j* which activate/deactivate the switches 52, 53 respectively. Switches 52 and 53 may be comprised of a PFET 44, supporting components such as a stabilizing and decoupling capacitor 45 and voltage divider resistors 46, 47.

If switch 52 is activated, the data line 19 is broken and the input 19 to the switch 52 differs from the output 56. The microcontroller 25 may provide a signal 57 from output 7*i* which can be electrically connected the output 56 of switch 52. These two signals may be DC voltages, which will follow Kirchhoff's laws when combined. The resulting signal 58 may exit the system 1 through the output connector 15 to communicate with the device 6.

Similarly, if switch 53 is activated, the data line 20 is broken and the input 20 to the switch 53 differs from the output 59. The microcontroller 25 may provide a signal 60 from output 7*k* which can be electrically connected the output 59 of switch 53. These two signals 59, 60 may be DC voltages, which will follow Kirchhoff's laws when combined. The resulting signal 61 may exit the system 1 through the output connector 15 to communicate with the device 6.

A user actuated switch 62 may be included as part of the IPDHID 1. This user actuated switch 62 may comprise simple mechanically actuated electrical connections 63 as well known and commonly implemented by those skilled in the art. When 62 is actuated the switch 63 may be connected to ground 12 which effectively sends a signal 64 to the input 7*m* of the microcontroller 25. This signal 7*m* from user switch 62 may then use the microcontroller 25 to activate or deactivate switches 52 and 53, which in turn may change the continuity of the data lines 19 and 20.

In the case when the IPDHID 1 is implemented as an embedded part of a larger system, the logical controller 25 may need more information about the power available from the power source before the voltage is regulated. An optional electrical connection 74 may be made directly to the output of the power source and give greater information about the state of the source. This may be advantageous because in many cases the output voltage of a power source is directly proportional to the amount of power available. Greater information allows the logical controller 25 to be programmed to cycle the bus power using switch 42 at appropriate times such as when a larger amount of power becomes available or to not cycle it when it will make no difference in the ultimate power drawn. The power source voltage signal 75 may be created by creating an electrical circuit to the voltage output of the power source external to the electrical connection 74 and to divide the power source voltage across a known resistor network 76. The logical controller reads the signal 75 from the electrical connection and voltage divider of 74 and according to its program, cycles the bus power from 14a to 14b appropriately.

FIG. 11 shows the arrangement of electrical pathways in USB junctions. The most common type of USB A (host side) 70 connector contains the 4 electrical connections that transmit power on the +5 Volt 68 and ground 65 and that carry data on the D+ 66 and D− 67 lines. Client Device sides of the connection USB B 71 typically contain an ID pin 69 that is used by the device to detect if a host is present or not. Those skilled in the art will know that USB data host devices and dedicated USB chargers deal with the distribution of power in quite different ways. USB is both a power distribution standard and data link. In the case where a data link is established between a client and a host over USB, the host device will dictate to the client device how much power may be drawn. The client device may negotiate with the host for more power but in many cases this requires installation of specialized and proprietary drivers on the host device. Dedicated USB charging ports such as those that convert household alternating current into 5 Volt direct current act as current limited sources to any USB device connected with the maximum power available as a limitation of the host USB charger. Some manufacturers have created their own standard to inform the device connected to a dedicated USB how much power is allowed to safely be drawn; typically this is based on a much simpler signal than serial bus communication. There are several internationally agreed upon standards and there are many manufacturer specific specifications. For example the USB B side (client device) of a USB mini-B 71 contains the 4 electrical connections that transmit power on the +5 Volt 68 and ground 65 and that carry data on the D+ 66 and D− 67 lines. A common method to indicate to a client device using the USB mini port 71 that it is connected to a dedicated charger port is to implement an electrical resistance of ~200 Ohms between D+ 66 and D− 67. Whereas the D+ 66 and D− 67 of a USB B micro connector are typically shorted with an electrical resistance of less than 1 Ohm between D+ 66 and D− 67. Other manufacturers use a proprietary connector with many pins. The added pins enhance functionality; however standard USB pins may also be contained within such Dock Connectors 73. This type of connector may also be used in conjunction with a cable that allows the device to be used with standard host side connections such as USB A 70 and transmit the 4 electrical connections that transmit power on the +5 Volt 68 and ground 65 and that carry data on the D+ 66 and D− 67 lines. Do to the very large number of accessories and the length of time that dock connectors 73 have been in use, proprietary standards have developed to allow the large number of devices with different power requirements to interact in the same accessory ecosystem without great risk of harm do to the use of incompatible devices. For example connection of a device that requires 2 A of current to a host charger that can only supply 500 mA of current could result in damage to the host charger. Those skilled in the art will note that simply providing a charger for all devices that can supply the maximum requirement of any device in the ecosystem is not economically viable as a device that needs only 500 mA at 5V will have an electrically simpler and less expensive host charger associated with it. Those skilled in the art familiar with the Dock Connector 73 know that the voltages output to the pins D+ 66 and D− 67 control the maximum current draw of devices using the Dock Connector 73. In the case where a host using the Dock Connector 73 can only provide 500 mA at 5V the D+ 66 and D− 67 will both be set at 2.0V informing the client device of the max charge specification of the host. In the case where a host using the Dock Connector 73 can only provide up to 1000 mA at 5V the D+ 66 and D− 67 will be set at 2.0V and 2.8V respectively informing the client device of the max charge specification of the host. In the case where a host connecting to a client device via the Dock Connector 73 can provide up to 2000 mA at 5V the D+ 66 and D− 67 will be set at 2.8V and 2.0V respectively informing the client device of the max charge specification of the host.

Figures 12A, 12B:
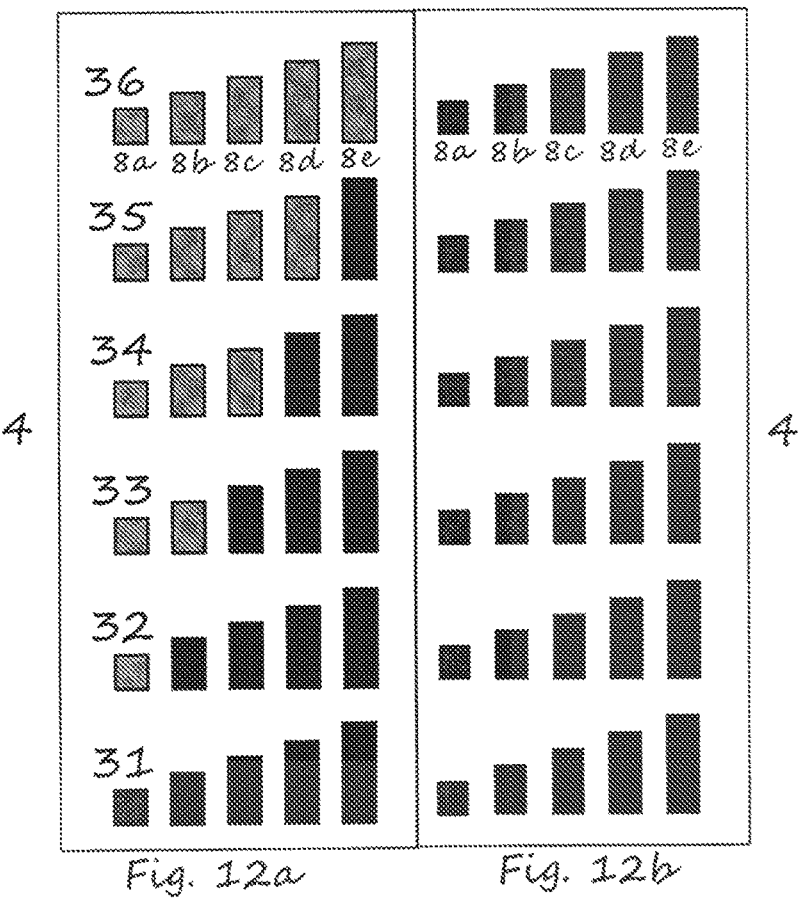
FIGS. 12a-d shows an output or display part of the Intuitive Power Display Human Interface device according to several embodiments.
Figure 12C:
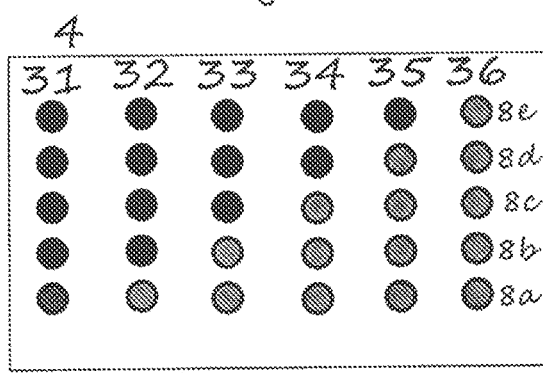
Figure 12D:
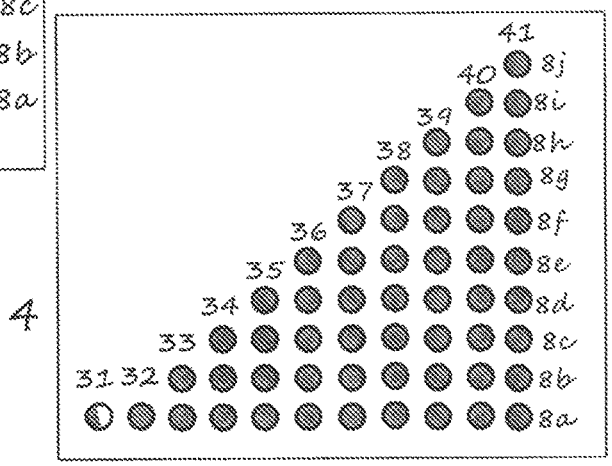

FIG. 12 shows possible embodiments of the intuitive human output display 4 through plausible methods of intuitive discrete display parts 8. The display 4 may implement many means of communicating the amount of power flowing through the system 1 through variations of the discrete methods of display 8. The discrete display units 8 are illuminated via the lighting components 16 in accordance to the amount of power transferring from the power source 5 to through the system 1 to the device 6 as previously described. The display 4 may implement many means of communicating the amount of power flowing through the system 1 through variations of the discrete methods of display 8 as illustrated in FIG. 12a, FIG. 12b, FIG. 12c, and FIG. 12d.

Shown in FIG. 12a is one embodiment of the human interface display 4 in which varying amounts of power 31, 32a, 32b, 32c, 32d, 32e are displayed through the discrete output units 8a, 8b, 8c, 8d, 8e. Reference number 31 corresponds to a voltage being detected from the source 5 with zero power transferring to the device 6 indicated by discretely illuminating 8a red. When the power sensor 2 detects power less than one watt transferring from source 5 to device 6 through system 1, the amount of power 32 is displayed through green illumination of unit 8a of the output interface 4. If FIG. 12a. represents the display 4 for a USB 2.0 device 6, increasing increments of power transference 32a, 32b, 32c, 32d, 32e from the source 5 to the device 6 of single watts of power until the maximum of 5 W can be described by the further green illumination of 8a, 8b, 8c, 8d, 8e.

Illumination colors of the discrete elements 8 in the output display 4 may vary in accordance with varying applications. For example, if the system 1 is an integrated part of a solar power generation system 5 the elements 8 may be illuminated blue, as seen in FIG. 12b, for increased visibility of the display 4 in direct sunlight. However, green may be preferred to blue due to its lower cost per unit in production. Alternately, varying colors of 8 may signify different power increments 31, 32a, 32b, 32c, 32d, 32e in comparison to different embodiment of similar systems 1. Such may be the case in the instance where green illumination, FIG. 12a, is used for USB 2.0 devices 6; whereas blue illumination, FIG. 12b, is used for USB 3.0 devices 6. In this scenario the power increments 32a, 32b, 32c, 32d, 32e would correspond to 1 W, 2 W, 3 W, 4 W, 5 W, and 2 W, 4 W, 6 W, 8 W, 10 W for USB 2.0 and USB 3.0 respectively.

The shape and relative sizes of the discrete elements 8 of the output display 4 may be varied between differing embodiments of the system 1 and remain in the spirit of the current invention. As the purpose of the system 1 is to convey the amount power transference from the source 5 to the device 6 by means of the output display 4 to a human user, the discrete display elements 8 are shown in FIG. 12*a* and FIG. 12*b* are rectangular bars of increasing size, in a similar fashion to internationally used wireless signal strength displays, in which illumination of increasing size discrete display bars 8*a*, 8*b*, 8*c*, 8*d*, 8*e* correspond to increasing amounts of power 32*a*, 32*b*, 32*c*, 32*d*, 32*e*. However, taking production costs under consideration, it may be advantageous for the discrete elements 8 to all consist of the same part as seen in FIG. 12*c*, as this decreases cost of production of the output display 4 and ultimately the system 1.

As shown in FIG. 12*d*, an alternate method using discrete display elements 8 in the human interface display 4 of another potential embodiment of system 1 may be desirable. In this potential embodiment the power display 4 comprises a matrix of discrete elements 8. In this instance, the amount of power 32 on the display 4 of the system 1 may correspond to increasing illumination of components 8 determined by the index of the matrix 8*ij*. Consider, for example, if FIG. 12*d* represents a 10 W display 4, when system 1 shows 8 watts 32*h* of power passing from the source 5 to the device 6, all discrete lighting elements 8 will be illuminated with indices corresponding to 8*a* through 8*h* and 8-1 through 8-8, or 8-1*a* through 8-8*h*.

The present invention utilizes the thermoelectric effect to generate electricity. More specifically, the temperature difference imposed across a thermoelectric element creates a voltage due to the differences in diffusivity and phonon drag imposed upon the n-type and p-type carriers within the thermoelectric element. Under the second law of thermodynamics, from statistical mechanics interpretation, the thermoelectric power of a material can also be defined as the entropy per charge carrier. The present invention harnesses the entropy created by the temperature differential imposed by the system, and transforms this entropy (heat) into electrical power.

The efficiency by which a thermoelectric element converts heat into electricity is quantified by the dimensionless figure of merit (ZT), defined as $ZT = S^2 * T * \sigma * 1/k$. Here, T is the average temperature between the hot and cold sides, S is the Seebeck coefficient, $\sigma$ is the electrical conductivity, and k is the thermal conductivity. The figure of merit for a given material varies as a function of temperature, performing best at temperatures where ZT is maximized.

Bismuth telluride ($Bi_2Te_3$) is one of the most common and least expensive thermoelectric materials in use today. Thermoelectric modules containing $Bi_2Te_3$ may be purchased from a variety of manufacturers across the globe. Bismuth telluride may be made p-type or n-type by introducing impurities of antimony or selenium, respectively. The present invention may utilize thermoelectric material comprising bismuth telluride, as the temperature of the hot (about 300° C.) and cold (about 100° C.) sides of the present invention coincides well with the temperature range in which ZT for bismuth telluride is maximized.

Bismuth telluride thermoelectric generation modules (TEGM) may comprise n-type and p-type doped legs which are electrically joined in pairs. These pairs are then connected in electrical series to raise the voltage. The number of pairs of legs connected in the series determines the relative output voltage of the module at a given temperature differential. Bismuth telluride thermoelectric legs are most commonly coupled using copper interconnects. These coupled pairs in series are encapsulated between two parallel insulating plates. Such plates are commonly made of alumina. TEGM are commercially available today from a variety of sources. The number of TEGM electrically connected within the system influences the electrical power output, and the size, shape, materials, and number of junctions within a given TEGM may be varied from application to application.

FIG. 13 shows one embodiment of a lightweight thermoelectric power generator system 101 in accordance with the teachings of the current invention. The system 101 includes a vessel 102 that may be placed upon a heat source 104. The heat source 104 may be a flame from a petroleum, alcohol, biomass, or another combustible fuel source, or the vessel 102 may be heated by other means, such as solar mirrors focused upon a bottom of the pot. The power generated by the thermoelectric generator system 101 may be routed through an internal high-temperature-resistant wire 105*a* into a temperature resistant wire conduit 106, and then to a temperature resistant connector 107 using a high-temperature-resistant wire 105.

The vessel 102 may be lightweight, have a handle 103, and may be designed to retain and heat a phase change material such as water. The handle 103, in addition to being used in the typical manner to hold and relocate the vessel 102, may also be used to hold the high-temperature-resistant connecting wire 105 at an increased distance from the heat source 104. This is achieved by routing the high-temperature-resistant wire 105 and the connector 107 through the handle 103 during normal operation of the system 101.

A power regulation assembly 108 is electrically coupled to the generation system 101 through the connector 107. In a particular embodiment, the power regulation assembly 108 incorporates the Power Display Human Interface device of FIG. 1-3, as detailed in FIG. 1-12 in this embodiment the Power Display Human Interface Device is incorporated within DC to DC regulation circuit 109*a*. The temperature-resistant wire 105 leads away from the heat source 104 into an environmentally hardened circuit enclosure 109, and connects to a DC to DC voltage regulation circuit 109*a*. The DC to DC voltage regulation circuit 109*a* provides regulated voltage through a standard connector 110 to a mobile device 111, such as a cellular phone.

Figure 14:
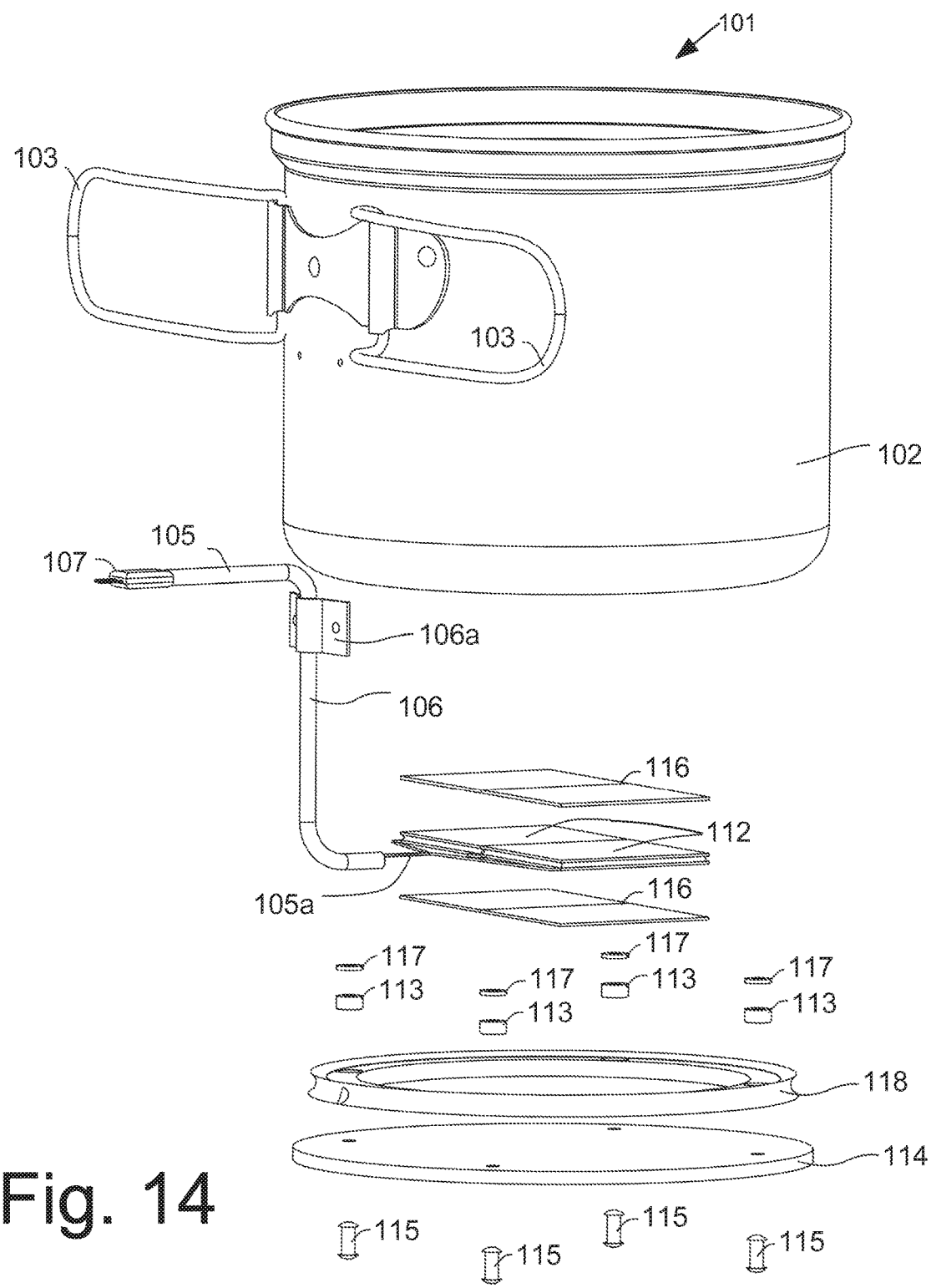
FIG. 14 is an exploded view of the portable thermoelectric power generation system of FIG. 13.
Figure 15:
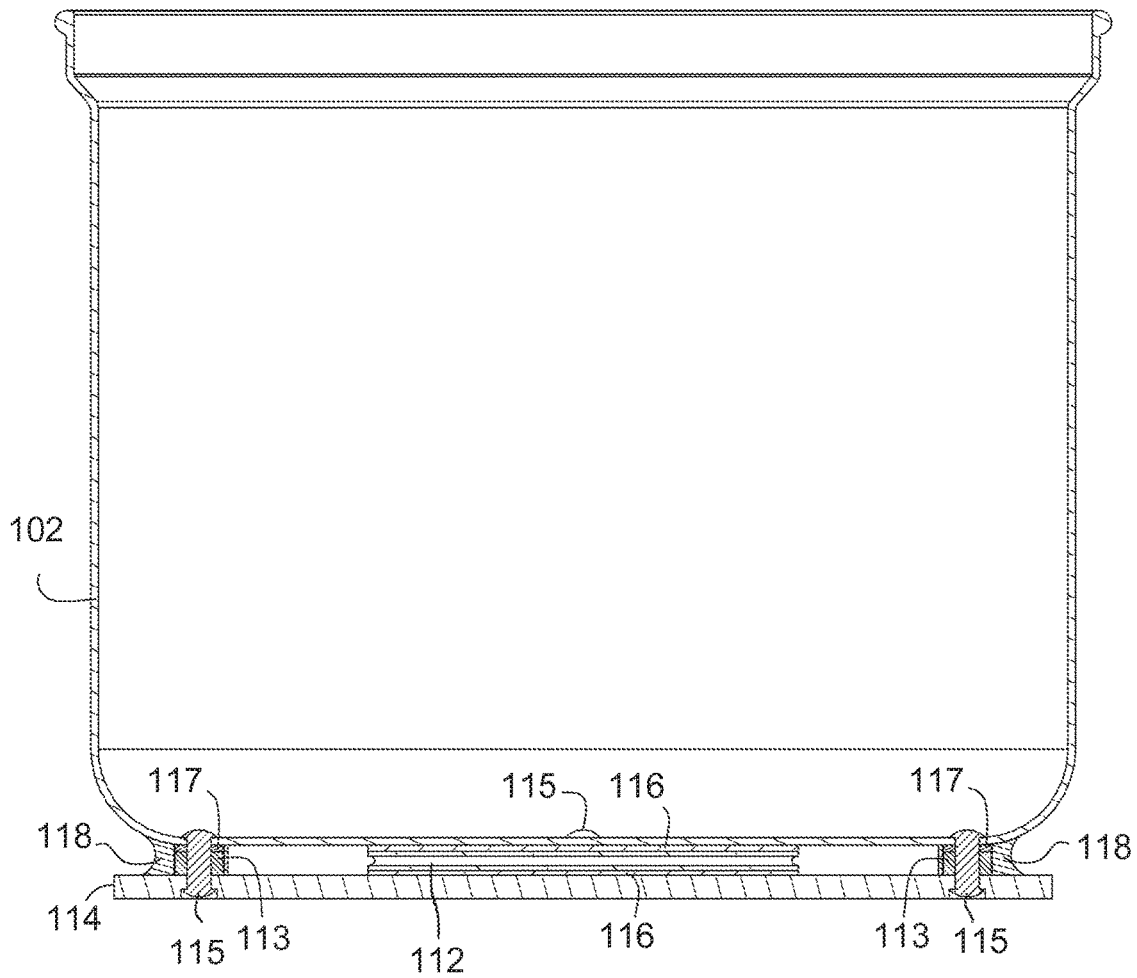
FIG. 15 is a side view showing the interrelationship between some of the components of the portable thermoelectric power generation system of FIG. 13.

FIG. 14 illustrates an exploded view of the lightweight thermoelectric generator system 101 comprising the vessel 102 to which the TEGM 112 are affixed. A plurality of spacers 113 of a height (~0.010") slightly greater than the height of the TEGM 112 span the gap between the vessel 102 and bottom plate 114 (see FIG. 3). A bottom plate 114 is secured to the vessel 102 using fasteners 115, such as rivets or screws, which pass through the spacers 113. In an alternative embodiment, bottom plate 114 is attached to the vessel by spot-welding the spacers to vessel and bottom plate to spacers. The spacers 113 maintain a gap between the vessel 102 and the bottom plate 114. The TEGM 112 are situated within this gap.

In order to prevent damage to the TEGM 112 from water, combustion byproducts, and other debris, this gap is sealed around the circumference of the bottom of the vessel 102 with a high-temperature gasket 118 (see FIGS. 2, 3). A thermal interface enhancer 116 is tape cast on both sides of the TEGM 112 in order to maintain intimate thermal contact between the TEGM 112, the vessel 102, and the bottom plate 114. Thermal interface inhibitors 117 are placed between the vessel 102 and the plurality of spacers 113, and help achieve a higher temperature differential across the TEGM 112, as discussed in more detail below.

Using the high temperature conduit 106, the wire 105 is guided out of the bottom of the system 101 towards the rim of the vessel 102 along the handle 103. All or part of the conduit 106 may be secured to, and be in intimate thermal contact with the vessel 102, so as to limit the temperature within the conduit 106. The high-temperature wire 105 may comprise two multi-strand copper conductor wires of gauge adequate for handling the power output of the system 101. The wire 105 conducts the electrical power from the TEGM 112 to the regulation assembly 108, and ultimately provides power to the mobile device 111 using the standard connector 110. A plurality of devices 111 may be powered by the system 102, with the voltage being set by the regulation circuit 109a. Examples of such devices 111 include single cell lithium ion batteries in mobile devices that are typically charged using a 5V supply, and appliances commonly used in cars and RVs requiring a 112V supply, such as lights and fans, or two cell lithium ion devices. A currently preferred embodiment utilizes standard connectors 110 such as USB or US AUTO/MARINE sockets for outputs of 5V and 112V respectively, though the output voltage can be adjusted through the regulation circuit 109a to provide power to (or charge) a wide variety of low power devices that use nonstandard voltages.

In a currently preferred embodiment of the system 101, the vessel 102 is stamped from a thin (0.0390") sheet of aluminum. Aluminum may be an exemplary material for the vessel 102 due to its high thermal conductivity (~250 W/mK), low density (2.7 g/cc), ease of formation, corrosion resistance, and low cost. The superior thermal conductivity allows for rapid dissipation of the heat from the TEGM 112, correspondingly creating an ultimately lower cold side temperature during operation of the system 101. Stainless steel, which is the most common material used to form vessels for boiling water, may also be employed to form the vessel 102. However, it is noted that the thermal conductivity of aluminum is more than ten times greater the thermal conductivity of stainless steel (~19 W/mK), and that the density of aluminum is about three times less than the density of stainless steel (7.9 g/cc). The use of aluminum to form the vessel 102, hence, may provide the system 101 with increased efficiency, portability, and profitability. Additionally, the surface of the aluminum vessel 102 may be hard anodized to a preferred thickness of 200 μm for electrical insulation, surface hardening, and corrosion resistance, which increases the robustness of the system 101 and reduces the possibility of a short circuit (through the vessel 102) if the electrical insulation of the internal high-temperature wire 105a sustains damage.

Each spacer 113 is a hollowed sleeve made of a high temperature material, such as a metal or ceramic, and is placed around the mechanical fastener 115 (e.g., rivets or screws). In an alternative embodiment, spacers 113 are formed as extensions of plate 114 as bottom plate 114 is stamped, thence formed into vertical legs that may be spot-welded or screwed to vessel 102. The spacers 113 bear most of the compressive loads involved in keeping the bottom plate 114 and the vessel 102 intact. This is advantageous as compared to placing such loads on the TEGM 112 itself, as damage to the TEGM 112 is prevented in case the system 101 experiences a shock, such as when an object accidentally falls into the vessel 102. Moreover, as the spacers 113 are closer to the edge of the bottom plate 114 as compared to the TEGM 112, mechanical stability of the system 1 upon impact on the edge of the bottom plate 114 (for e.g., when system 101 is dropped) is also improved, because of the decrease in the bending moment/lever arm distance. Additionally, the spacers 113 prevent deformation of the bottom of the vessel 102 during attachment of the bottom plate 114 with the fasteners 115. This may be particularly desirable as it keeps the bottom of the vessel 102 flat, allowing for intimate thermal contact with the flat surfaces of the TEGM 112. The material and wall thickness of the spacers 113 may be varied to allow for more or less thermal conductance through the spacers 113 as compared to the TEGM 112; this provides a means with which to prevent the TEGM 111 from overheating (for e.g., when the vessel 102 and the bottom plate 114 have a much larger cross-sectional area than the TEGM 112.)

To insure optimized thermal contact while maintaining mechanical stability of the system 101, the TEGM 112 are affixed to the vessel 2 as described herein. The bottom plate 114 may be made of a variety of high temperature resistant materials, though it may be desirable for the bottom plate 114 to be made of material having a high thermal conductivity. The thickness of (and type of material used to make) the bottom plate 114 may depend on several considerations. For example, minimizing the thickness of the bottom plate 114 may help to maintain low weight and high thermal conductance. Conversely, however, a thicker bottom plate 114 may help to preserve structural integrity of the system 101 in case it is dropped. Moreover, if the bottom plate 114 is not sufficiently thick, damage may result due to high temperature creep, or deformation may occur due to thermal cycling or thermal annealing. Keeping these and other relevant considerations in mind, the bottom plate 114 in a currently preferred embodiment is made of one eighth inch thick solution heat treated and artificially aged rolled T6 5052 aluminum.

Thermal transport can occur through a variety of different mechanisms depending on the scenario. In electrically insulating solids, thermal transport occurs primarily through phonon transfer. A phonon is an excited quantum vibrational state in which the lattice of a material oscillates at a given frequency. There is not a single vibrational frequency of phonons in a system, but rather a distribution which follows the dispersion relation. The speed of sound in a given material is the speed at which phonons (and therefore heat) is transferred through the lattice. In solids that are electrically conductive, heat is also carried by charge carriers in accordance with Wiedemann-Franz law. In gasses, thermal transport occurs through simple diffusion and convection.

In a vacuum, thermal energy is transferred through electromagnetic radiation, and is generally referred to as radiative heat transfer. Radiative heat transfer is not only limited to vacuums, but rather is omnipresent as electromagnetic energy emitted from any black body. It is well know that radiative heat transfer occurs in proportionality to the temperature raised to the fourth power; thus, radiative heat transfer is virtually inconsequential at low temperatures, and becomes increasingly dominant at higher temperatures. The thermal transport within the thermoelectric power generation system 101 described herein is generally limited to solids, with phonon transfer and radiative heat transfer being the two major transport mechanisms.

The overall thermal impedance (analogous to electrical impedance) of heat transfer from the bottom plate 114 to the vessel 102 through the TEGM 112 is decreased using the thermal enhancer 16 at the interfaces of the TEGM 112 with the vessel 2 and the bottom plate 114. Contrarily, the spacers 113, in conjunction with the thermal inhibitors 117, serve to increase the thermal impedance. Resultantly, there is a larger thermal conductance through the TEGM 112 as compared to spacers 113, which increases the power output and efficiency of the system 101.

Further, improved thermal conductance is achieved by ensuring that phonon transport, as opposed to radiative transfer, is the dominant heat transfer mechanism in system 101 at both the macroscopic and microscopic scales, which is particularly important in the relatively low temperature regime in which the system 101 operates. For instance, to increase power output, the temperature at the interface of the vessel 2 and the TEGM 112 needs to be minimized, and radiative transfer is particularly undesirable because it causes a drastic increase in the thermal impedance at this interface. The thermal enhancer 16 serves the purpose of decreasing void space on both macroscopic and microscopic scales, allowing for the heat transfer to occur primarily by means of phonon transfer. Microscopic voids are not to be understated, as they are present at virtually all interfaces due to the finite smoothness of virtually any material surface, such as those of the alumina on the TEGM 112 and the anodized vessel 102. The roughness of these surfaces may be minimized through careful processing, such as slow anodization and fine polishing; however, these steps may increase the cost and difficulty of the production significantly.

The thermal interface enhancer 116 developed as part of the assembly of the system 101 may be a highly malleable and thermally conductive material. The thermal enhancer 116 may be composed of a mixture of thermally conductive particles, such as metallic aluminum or aluminum oxide and high temperature grease. Metallic particles are desirable due to their superior thermal conductivity, low cost, and malleability. Malleable particles enhance thermal conductivity due to their ability to conform to surface features smaller than the particle size, and also improve packing inside the matrix, thereby increasing the number of contacting particles. Grease may be a desirable matrix, though other highly malleable materials such as silicones may also be used, due to their singular molecular structure. The use of a matrix material may significantly decrease the number of void spaces, and may noticeably improve the thermal characteristics of system 101, particularly at the interfaces of TEGM 112 and the vessel 102/bottom plate 114. The application of grease as the matrix material for the thermal enhancer 116 is advantageous due to single molecule microstructure of said grease. Single molecules can easily flow into void spaces that would be otherwise inaccessible to other suitable malleable matrix materials, such as silicones, because other materials generally comprise a more heavily bonded microstructure. These bonds (e.g. crosslinks) prevent the material from flowing into the microscopic void spaces, and therefore impede the performance of the system 101.

Minimizing void spaces increases the rate of heat transfer in the system 101 as a more continuous path for phonon transport is then available. The particle size and the type of grease may be varied for the particular application. In a currently preferred embodiment, 30 micron aluminum particles are added to non-melting, incombustible, low migration high temperature polyalphaolefin grease. The volume fraction of particles embedded in the grease matrix may affect both the thermal and mechanical properties of the thermal interface enhancer 116. In a currently preferred embodiment the volume fraction of particles is greater than 0.5. Polyalphaolefin greases are commercially available from TOMPAC Inc. The polyalphaolefin grease also acts as an oxygen barrier, shielding the metallic particles from oxidizing into a less thermally conductive oxide material.

This high viscosity slurry of enhancer 116, in addition to thermally linking the TEGM 112 to the vessel 102 and bottom plate 114, also reduces the risk of damage to the TEGM 112 when the system 101 experiences a shock (such as when it is accidentally dropped). Additionally, the particles distributed throughout the matrix physically impede the migration of grease, and prevent the movement of the TEGM 112 with respect to the vessel 102 and the bottom plate 114. This ensures optimized thermal contact and mechanical stability throughout the lifetime of the system 101, and allows the system 101 to better endure thermal cycling, general use, and transportation. The addition of high thermal conductivity particles to the grease may be well in excess of the percolation threshold (~16% for spherical particles) for optimized thermal conductivity and shear viscosity. This ensures maximized physical contact between adjacent particles, allowing for thermal conduction to occur through phonon transfer along a high-speed metallic pathway. Likewise, as previously noted, the interconnectedness of this pathway may prove to be a barrier to matrix migration.

The TEGM 112 are placed on the bottom of the vessel 102, and the wires 5a may be thermally linked and mechanically fastened to the vessel 102. As noted, coupling the wires 5a to the vessel 2 thermodynamically limits the maximum temperature rise available to the wire due to the presence of a phase change material in the vessel 102.

A thermal interface inhibitor 117 may be used during assembly in order to mitigate unwanted thermal transport during the operation of the system 101. The thermal interface inhibitor 117 is added to help increase the localized temperature differential between the vessel 102 and the bottom plate 114 at the spacers 113, which aids in the maintenance of a temperature differential across the TEGM 112, and thereby increases the output voltage of the system 101. The material selected for the thermal interface inhibitor 117 may have a thermal conductivity less than 1 W/mK. In a currently preferred embodiment the thermal interface inhibitor 117 material is a cross-linked silicone polymer fiber glass composite. Usage of this composite in the thermal interface inhibitor 117 also serves to absorb shocks and vibrations sustained by the system 101 that may otherwise be transmitted to the TEGM 112, and therefore increases the reliability and durability of the system 101.

Thermal conductance through the spacers 113 is minimized through controlling the phonon transport at the interface of the spacers 113 and the vessel 102. This is achieved through the use of amorphous and low stiffness materials, which are known to have decreased phonon transport relative to materials possessing a regular lattice structure. Examples of such materials are silicones that are both amorphous and have a low elastic modulus, and glasses which are amorphous by definition. Composites may also be made by combining these two material classes, so as to increase mechanical strength and to impede phonon transport at the spacers 113.

The thermal gasket 118 may be composed of a high temperature and flame resistant material, and serves to encapsulate and protect the TEGM 112 from environmental damage due to dirt, liquid, fuel, or combustion byproducts. The gasket 118 also creates thermal discontinuity between the vessel 2 and the bottom plate 114. In a currently preferred embodiment the gasket 118 is made of cross-linked polydimethylsiloxane silicone rubber composite that is highly resistant to temperature, corrosion, and abrasion. A composite material is created by the addition of a second phase such as fiberglass that improves the mechanical strength and further decreases the thermal conductivity of the gasket 118. Such a composite may be desirable for enclosing the gap between the vessel 102 and the bottom plate 114 as compared to metallic material, as the low thermal conductivity of the composite allows for a larger temperature gradient across the TEGM 112, and thereby increases the power output of the system 101. The gasket 118 may be made in a mold or formed in place between the vessel 2 and the bottom plate 114. The thermal gasket 18 may also serve to dampen vibrations and shocks endured by the system 101.

In a currently preferred embodiment, the high temperature resistant wire 105 is optimized for durability and environmental toughness. Multi-strand wires have higher conductivity than a single strand of equivalent gauge, and are more capable of withstanding higher mechanical deformation cycling sustained during regular operation of the system 101 (and its use with the voltage regulation assembly 108). The conducting wire 105 may be insulated with a high temperature dielectric material such as polytetrafluoroethylene, cross-linked polydimethylsiloxane, or a polyimide. In a currently preferred embodiment the high-temperature wire 105 is a polytetrafluoroethylene insulated wire, inside a braided stainless steel jacket, within a polytetrafluoroethylene sleeve. The braided jacket serves to distribute a thermal hot spot over a greater length of the wire 105, thus decreasing the risk of electrical failure due to overheating. The wire 105 is then put inside a self-extinguishing cross-linked polydimethylsiloxane-fiberglass composite sleeve. This outer sleeve adds additional thermal and abrasion protection to the enclosed wire 105, preventing overheating and mechanical wear.

The conduit 106 protecting the high temperature wire 105 may be made of aluminum, which is easily formed to fit the shape of the vessel 102. Aluminum is also favorable as its high thermal conductivity prevents localized heating of the enclosed wire 105, and the relatively high toughness of aluminum decreases the risk of damage to the wire 105 due to impact. Additionally the high-temperature wire conduit 106 is physically attached and thermally linked to the vessel 102 using a metal strap 106a, that serves to increases both the mechanical and thermal robustness of the wire 105 by limiting the maximum temperature rise of the conduit 6 and the enclosed wires 105.

The high-temperature connector 107 may be a 2 pin DC power connector with a molded high-temperature material, such as porcelain or glass-nylon composite housing. This connector 107 is designed for high-temperature environments where it is necessary to make DC electrical connections. An example of such a connector 107 appears in U.S. Pat. No. 6,267,626, which is incorporated herein by reference. Such connectors 107 are commercially available through a number of sources, for example, the OMEGA corporation.

When heat is applied to the heat receiving side of the system 101 (i.e., the bottom plate 114), the initial temperature differential across the TEGM 112 is small, and hence, the voltage produced by the TEGM 112 may be too small to be useful. Additionally, during normal operation, fluctuations in the temperature of the hot and cold sinks can produce significant fluctuation in the unregulated output voltage of the system 101, both above and below the required output voltage required to provide power to the mobile device 111. Additionally, when a large thermal difference is experienced by the TEGM 112, the output voltage of the generation system 101 may be above the voltage required by the mobile device 111, which, if unregulated, may damage the device 111. In a currently preferred embodiment, the challenge of providing a stable output voltage to the mobile device 111 is overcome through the use of a commercially available pulse width modulation (PWM) DC to DC voltage conversion circuit 109a contained in enclosure 109. Thus, voltages below those needed by the mobile device 111 are boosted, and voltages above those needed are reduced to the desired output voltage. Recent advances in the art of pulse width modulation DC/DC conversion electronics allow these circuits to operate with over 90% efficiency, and allow them to occupy relatively little physical space. This allows for the voltage regulation assembly 108 to be highly compact and lightweight. State-of-the-art voltage regulation pulse width modulation controllers are commercially available from a variety of providers, including, for example, Maxim and Texas Instruments.

Physical separation of the power regulation electronics 9a from the heat source 104 and the vessel 102 via the temperature resistant wire 105 serves to protect the power regulation electronics 109a from damage due to overheating. Additionally, the power regulation circuit enclosure 109 provides physical protection to the regulation circuit 9a. The circuit enclosure 9 may also be filled with epoxy to protect the voltage regulation circuit 9a from damage due to shock or moisture. High thermal conductivity epoxy is preferred as it prevents overheating by conducting heat generated by the regulation circuit 109a during operation. The standard electrical connector 100 may extend from the circuit enclosure 109 or may be contained within the circuit enclosure 109. The power regulation assembly 108 is electrically coupled to the generation system 101 through the high temperature connector 107. This allows for the regulation assembly 108 to be detached from the system 101, thereby increasing the ease of transportation and storage of the system 101. Additionally the power regulation circuit 109a may be modified for different output voltages with distinct regulation assemblies 108 tailored to the desired application. Detachability of the regulation assembly 108 allows for the same generation system 101 to be used interchangeably with different regulation assemblies 108, as may be required for different devices 111.

Figure 16:
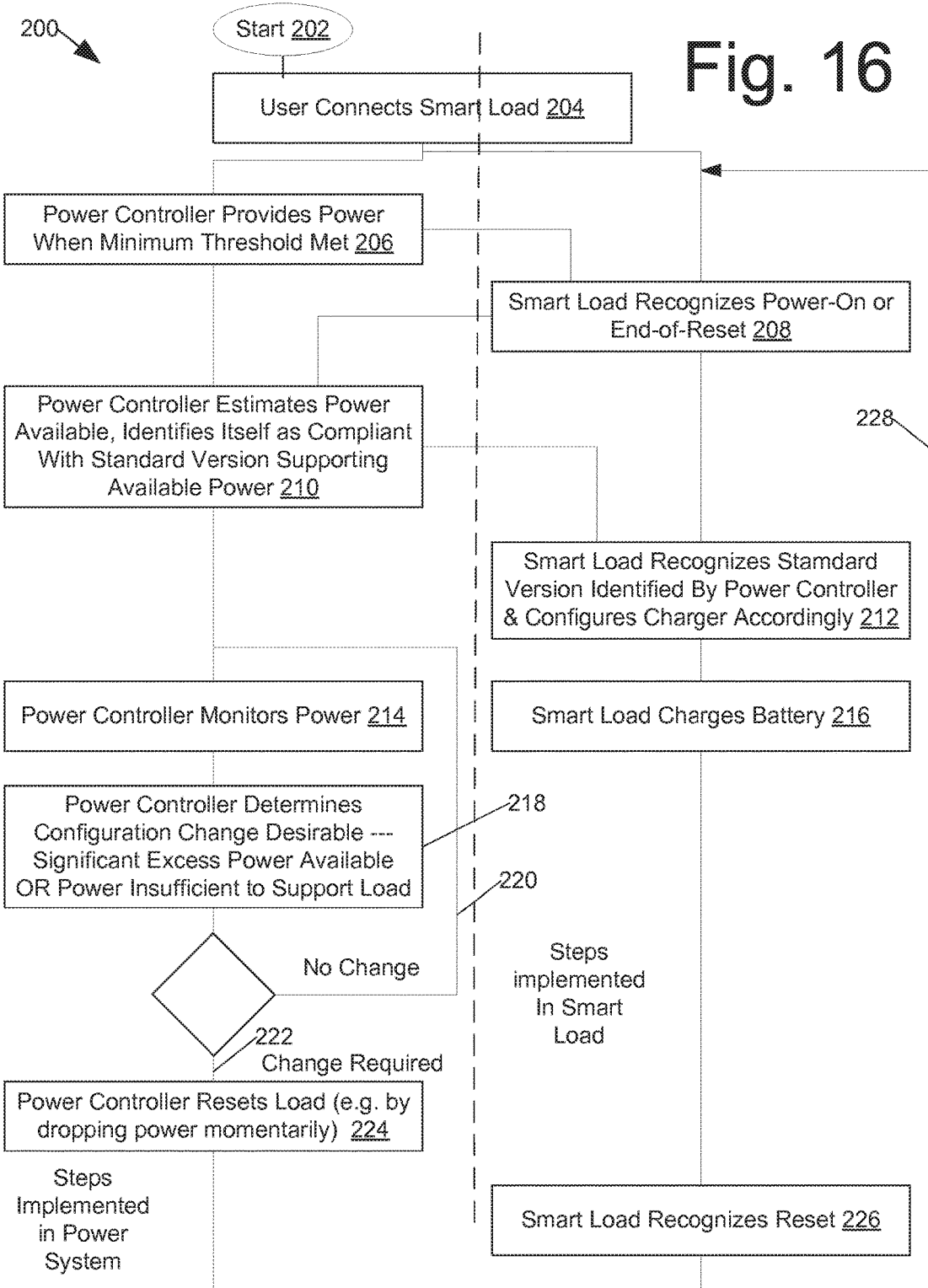
FIG. 16 is a flowchart of a method of battery charging implemented by embodiments of the system of FIGS. 1-3 and FIG. 14.

A method 200, implemented by a combination of circuitry in a smart load 111 and in the DC-DC regulation circuit 109a within module 109 is illustrated in FIG. 16. This method starts 202 with a user connecting 204 a power source, whether it be a thermoelectric generator system 101 or a photovoltaic panel 5 to the regulation circuit 109a and the regulation circuit 109a to the smart load 111. Actions performed within the regulation circuit are on the left side of FIG. 16, while those within the smart load 111 are on the right side of FIG. 16. The regulation circuit 109a then provides 206 a voltage meeting the standard voltage level, which for a USB-compatible smart load is five volts, to the smart load. In an embodiment, the regulation circuit waits for voltage and current provided by the power source to reach a minimum value before providing power to the load. The regulation circuit also estimates an amount of power available, and in embodiments configures an interface to provide a power-available indication to the smart load, thereby communicating the amount of power available to the load. In a particular USB embodiment, this power available is indicated by voltages on data pins of the USB interface. In an alternative embodiment, the regulation circuit configures itself to interact with the smart load using a serial handshake over the interface to indicate compliance with a particular standard of interface that implies particular amounts of power available to the load, and thereby communicate the amount of power available to the smart load.

Once power is provided 206 to the smart load 111, the smart load recognizes 208 that power is present and determines 212 an amount of power available by reading voltages of data pins of the interface with the regulation circuit, or by interacting serially with the regulation circuit. Once the amount of power available is determined, the smart load configures its battery-charging circuitry to use an amount of power not exceeding the amount of power available. In a USB-compatible embodiment, the smart-load configures itself as a USB-1, USB-2, or a USB-3 compliant load by setting the battery charging circuit to draw a corresponding low, medium, or high current from the regulation circuit, where the current drawn by the battery charging circuit is as high as practical while remaining within the amount of power available.

The regulation circuit or power controller then continually monitors 214 current drawn by the load, while the load continues to charge 216 its battery. The regulation circuit or power controller provides visual indication of load current as previously described. The power controller also periodically determines that the amount of current drawn by the smart load 111 is appropriate for an amount of power available from the power source 5, 101. It should be noted that power used by a smart load may often exceed the amount of power used by the battery charger of the load because the load my, for example, use power for other functions; in an embodiment where the load is a cell phone or tablet computing device, the smart load may operate a processor and a radio to communicate with cell towers. If the power available is appropriate, no change 220 to configuration is required. If a large excess of power is available and not being used, or if the current drawn by load 111 is less than the amount of power available, the power controller determines that a change 222 to configuration is required.

If a change in configuration is required to optimize battery charging time, the power controller/voltage regulator circuit 109a resets 224 the load by, in an embodiment, disconnecting power to the smart load. In an alternative embodiment, the power controller uses another method of communicating a reset signal to the load, such as a serial reset command. The smart load then recognizes 226 the reset condition, preparing itself 228 for reconnection to power resulting in a new power-on condition 208 or an end-of-reset condition; and, in an embodiment after a timeout of one-half to five seconds, the power controller resumes providing power 206 to the load, and updates its estimate 210 of power available and load power consumption.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

In an embodiment of the method of FIG. 16, the power controller initially estimates a low level of power available, and configures the load accordingly. After a first interval of time, if the power source has not become overloaded, the power controller estimates a mid-level of power available, resets the load, and configures the load accordingly; if the power source continues as not overloaded for another first interval of time, the power controller estimates a mid-level of power available and configures the load accordingly. If the power source becomes overloaded, the power controller immediately backs down by one level of power available, resets the load, and configures the load accordingly. Once an appropriate load configuration that does not overload the power source, if the power provided is maximum the power controller continues providing power indefinitely. If the power provided is less than maximum, the power controller provides power to the load for a second interval of time, greater than or equal to the first interval of time, then periodically resets the load to try a higher power configuration. The system therefor hunts for an optimum setting of the battery charger in the load.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween. It is also anticipated that steps of methods may be performed in an order different from that illustrated and still be within the meaning of the claims.

The invention claimed is:

1. An apparatus for optimizing charging of a smart load, the smart load being capable of receiving power at least at a first power-reception level and a second power-reception level, the second power-reception level being greater than the first power-reception level, the apparatus comprising:
   a solar panel;
   a controller operably coupled to the solar panel; the controller configured to periodically monitor an amount of power received by the smart load when the smart load is in electronic communication with the solar panel;
   a display configured to provide a visual representation of said amount of power; and
   an interrupting device in communication with the controller;
   wherein:
   said controller determines an actual power-reception level at which said smart load is being powered;
   said controller causes said interrupting device to interrupt power flow to said smart load for an interruption period when said actual power-reception level is equal to said first power-reception level;
   said smart load receives no power for said interruption period and resets as a result of said interruption to receive power at said second power reception level; and
   said interruption period is in a range of 0.5 to 5 seconds.

2. The apparatus of claim 1, wherein the controller is further configured to cause the interrupting device to interrupt power flow to the smart load when: (a) the smart load is attempting to draw power at the second power-reception level; and (b) the solar panel is unable to provide sufficient power to the smart load at the second power-reception level.

3. The apparatus of claim 1 wherein the display includes a plurality of light emitting diodes.

4. The apparatus of claim 3 wherein the display is a bar graph display.

5. The apparatus of claim 1 further comprising signaling circuitry configured to signal circuitry of the smart load with information regarding a power-availability level.

6. The apparatus of claim 1 further comprising a connector configured to electronically couple the smart load to the solar panel.

7. The apparatus of claim 6 wherein the connector is a USB connector.

8. The apparatus of claim 7 wherein the USB connector is connectable to any one of a plurality of smart loads, said plurality of smart loads comprising a first smart load and a second smart load, the first smart load being configured to be charged at a first voltage, the second smart load being configured to be charged at a second voltage that is greater than the first voltage.

9. The apparatus of claim 8 wherein the interrupting device includes a switch.

10. An apparatus for charging a smart load, comprising:
 a solar panel;
 a controller operably coupled to said solar panel; said controller configured to monitor a charging characteristic of said smart load when said smart load is electronically coupled to said solar panel;
 an interrupting device in communication with said controller;
 wherein:
 said controller is configured to cause said interrupting device to interrupt power flow to said smart load for an interruption period based on an evaluation of said charging characteristic of said smart load;
 said smart load receives no power for said interruption period and resets as a result of said interruption to receive a new power reception level that is greater than an original power reception level; and
 said interruption period is in a range of 0.5 seconds to 5 seconds.

11. The apparatus of claim 10, further comprising a display configured to provide a visual representation of power received by the smart load.

12. The apparatus of claim 11, wherein the display includes a plurality of light emitting diodes.

13. The apparatus of claim 10, wherein the controller comprises current measuring circuitry.

14. The apparatus of claim 10, further comprising power monitoring circuitry to detect an overload condition.

\* \* \* \* \*